(12) United States Patent
Izumoto et al.

(10) Patent No.: US 9,997,382 B2
(45) Date of Patent: Jun. 12, 2018

(54) SUBSTRATE PROCESSING APPARATUS AND SUBSTRATE PROCESSING METHOD

(71) Applicant: SCREEN Holdings Co., Ltd., Kyoto (JP)

(72) Inventors: Kenji Izumoto, Kyoto (JP); Takemitsu Miura, Kyoto (JP); Kenji Kobayashi, Kyoto (JP); Kazuhide Saito, Kyoto (JP); Akihisa Iwasaki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days. days.

(21) Appl. No.: 15/256,052

(22) Filed: Sep. 2, 2016

(65) Prior Publication Data

US 2017/0053815 A1 Feb. 23, 2017

Related U.S. Application Data

(62) Division of application No. 14/178,887, filed on Feb. 12, 2014.

(30) Foreign Application Priority Data

Feb. 14, 2013 (JP) .................................. 2013-026224
Feb. 15, 2013 (JP) .................................. 2013-027387

(51) Int. Cl.
*H01L 21/67* (2006.01)
*H01L 21/306* (2006.01)
(Continued)

(52) U.S. Cl.
CPC .... *H01L 21/6708* (2013.01); *H01L 21/02052* (2013.01); *H01L 21/30604* (2013.01);
(Continued)

(58) Field of Classification Search
None
See application file for complete search history.

(56) References Cited

U.S. PATENT DOCUMENTS 5,677,000 A 10/1997 Yoshioka et al. ............. 427/240
7,008,879 B2 3/2006 Lee et al. ....................... 438/758
(Continued)

FOREIGN PATENT DOCUMENTS

JP 09-001035 A 1/1997
JP 11-340187 A 12/1999
(Continued)

OTHER PUBLICATIONS

Machine Generated English Translation of TW 498396 published Aug. 11, 2002.

*Primary Examiner* — Allan Olsen
(74) *Attorney, Agent, or Firm* — Ostrolenk Faber LLP

(57) ABSTRACT

In a substrate processing apparatus, an outer edge portion of a substrate in a horizontal state is supported from below by an annular substrate supporting part, and a lower surface facing part having a facing surface facing a lower surface of the substrate is provided inside the substrate supporting part. A gas ejection nozzle for ejecting heated gas toward the lower surface is provided in the lower surface facing part, and the substrate is heated by the heated gas when an upper surface of the rotating substrate is processed with a processing liquid ejected from an upper nozzle. Further, a lower nozzle is provided in the lower surface facing part, to thereby perform a processing on the lower surface with a processing liquid. Since the gas ejection nozzle protrudes from the facing surface, a flow of the processing liquid into the gas ejection nozzle can be suppressed during the processing.

4 Claims, 13 Drawing Sheets

(51) Int. Cl.
*H01L 21/02* (2006.01)
*H01L 21/687* (2006.01)

(52) U.S. Cl.
CPC .. *H01L 21/67023* (2013.01); *H01L 21/67028* (2013.01); *H01L 21/67109* (2013.01); *H01L 21/67126* (2013.01); *H01L 21/68792* (2013.01)

(56) References Cited

U.S. PATENT DOCUMENTS

| | | | |
|---|---|---|---|
| 7,182,821 B2 | 2/2007 | Izumi et al. | 134/36 |
| 7,935,217 B2 | 5/2011 | Yashiki et al. | 156/345.17 |
| 8,016,976 B2 | 9/2011 | Kamei et al. | 156/345.55 |
| 8,020,570 B2 | 9/2011 | Kishimoto | 134/148 |
| 8,828,183 B2 | 9/2014 | Namba et al. | 156/345.21 |
| 9,147,593 B2 | 9/2015 | Lach | |
| 2002/0002991 A1 | 1/2002 | Lindner | 134/153 |
| 2003/0034056 A1 | 2/2003 | Amai et al. | 134/93 |
| 2003/0140949 A1 | 7/2003 | Sugimoto et al. | 134/33 |
| 2004/0084144 A1 | 5/2004 | Yokouchi et al. | 156/345.11 |
| 2006/0027323 A1 | 2/2006 | Miya et al. | 156/345.23 |
| 2006/0234503 A1 | 10/2006 | Yamada et al. | 438/667 |
| 2008/0035610 A1 | 2/2008 | Miya et al. | 216/84 |
| 2009/0075484 A1 | 3/2009 | Song et al. | 438/748 |
| 2009/0079122 A1 | 3/2009 | Obweger | 269/57 |
| 2010/0313915 A1 | 12/2010 | Fujiwara et al. | 134/33 |
| 2011/0240601 A1 | 10/2011 | Hashizume et al. | 216/83 |
| 2011/0250044 A1 | 10/2011 | Obweger et al. | 414/757 |
| 2011/0253181 A1 | 10/2011 | Obweger et al. | 134/157 |
| 2011/0290283 A1 | 12/2011 | Obweger et al. | 134/104.2 |
| 2011/0304107 A1 | 12/2011 | Obweger et al. | 279/60 |
| 2012/0018940 A1 | 1/2012 | Kumnig et al. | 269/225 |
| 2012/0103522 A1 | 5/2012 | Hohenwarter | 156/345.23 |
| 2012/0305036 A1 | 12/2012 | Lach et al. | 134/137 |
| 2013/0008602 A1 | 1/2013 | Hohenwarter | 156/345.23 |
| 2013/0171831 A1 | 7/2013 | Namba et al. | 438/748 |
| 2014/0273498 A1 | 9/2014 | Kobayashi et al. | 438/745 |
| 2014/0349489 A1 | 11/2014 | Kinoshita | 438/748 |

FOREIGN PATENT DOCUMENTS

| | | |
|---|---|---|
| JP | 2001-044159 A | 2/2001 |
| JP | 2001-068443 A | 3/2001 |
| JP | 2002-305173 | 10/2002 |
| JP | 2002-305177 | 10/2002 |
| JP | 2003-282521 | 10/2003 |
| JP | 2004-056006 A | 2/2004 |
| JP | 2004-158588 | 6/2004 |
| JP | 2005-175228 | 6/2005 |
| JP | 2007-529106 A | 10/2007 |
| JP | 2010-050143 A | 3/2010 |
| JP | 2010-067819 A | 3/2010 |
| JP | 2010-80584 A | 4/2010 |
| JP | 2010-093189 A | 4/2010 |
| TW | 498396 B | 8/2002 |
| TW | 200924097 A | 6/2009 |

SUBSTRATE PROCESSING APPARATUS AND SUBSTRATE PROCESSING METHOD

CROSS-REFERENCE TO RELATED APPLICATIONS

This application is a divisional of U.S. patent application Ser. No. 14/178,887, filed Feb. 12, 2014, which claims the benefit of Japanese Patent Application Nos. 2013-026224, filed Feb. 14, 2013 and JP 2013-027387, filed Feb. 15, 2013, which are incorporated herein by reference.

TECHNICAL FIELD

The present invention relates to a substrate processing apparatus and a substrate processing method.

BACKGROUND ART

In a process of manufacturing a semiconductor substrate (hereinafter, referred to simply as a "substrate"), conventionally, various processings are performed on a substrate by using a substrate processing apparatus. Japanese Patent Application Laid-Open No. 2004-158588 (Document 1), for example, discloses a substrate processing apparatus capable of removing organic substances deposited on a substrate by using a removal liquid. In the substrate processing apparatus, by supplying temperature-controlled nitrogen gas onto a back surface of the substrate from a back-surface side gas nozzle before supplying the removal liquid onto the substrate from a removal liquid nozzle, a temperature of the substrate becomes close to that of the removal liquid. It is thereby possible to make the temperature of the removal liquid flowing on a surface of the substrate almost uniform on the entire surface of the substrate and improve the inplane uniformity of the processing of removing the organic substances.

In another example, by supplying a chemical liquid onto a substrate having a surface on which a resist pattern is formed, a processing such as etching or the like is performed on the surface of the substrate. Further, Japanese Patent Application Laid-Open No. 2002-305177 (Document 2) discloses a substrate processing apparatus for processing a substrate having a surface on which a thin film formed thereon is patterned by dry etching with a resist film as a mask, and the substrate processing apparatus is capable of removing reaction products formed on the surface of the substrate by using a removal liquid. In the substrate processing apparatus of Document 2, a cup for capturing the removal liquid scattered from the substrate being rotated is provided, and by reducing the exhaust of atmosphere in the cup in removing the reaction products with the removal liquid, it is possible to effectively prevent deterioration in the removal capability for the reaction products due to vaporization of water from the removal liquid, or the like.

In the substrate processing apparatus of Document 1, which includes a vacuum chuck having an adsorption surface and holds the substrate by adsorption with the vacuum chuck, it is impossible to perform any processing onto an entire lower surface of the substrate by using a processing liquid. Further, in a configuration in which a gas ejection nozzle facing the lower surface of the substrate is provided and a processing liquid is supplied onto the lower surface, in order to prevent any failure of the gas ejection nozzle due to a flow of the processing liquid into the gas ejection nozzle, required is a technique for suppressing the flow of the processing liquid into the gas ejection nozzle.

On the other hand, in the apparatus in which a processing is performed in the cup, like in Document 2, if gas containing a chemical liquid component is diffused out of the cup, there is a possible that the gas may have some effect on devices and the like disposed around the cup, and accordingly it is absolutely necessary to exhaust the atmosphere in the cup. Therefore, there is a limitation in suppressing the vaporization of the chemical liquid by reducing the exhaust. Actually, since there occurs a decrease in the temperature especially at an outer edge portion of the substrate, it is impossible to improve the uniformity of the processing using the chemical liquid.

SUMMARY OF INVENTION

The present invention is intended for a substrate processing apparatus for processing a substrate, and in a substrate processing apparatus in which an upper surface of a substrate is processed with a processing liquid while the substrate is heated with heated gas ejected from a gas ejection nozzle, it is an object of the present invention to perform a processing onto a lower surface of the substrate with a processing liquid and further to suppress a flow of the processing liquid into the gas ejection nozzle during the processing. It is another object of the present invention to perform uniform processing onto the upper surface of the substrate.

The substrate processing apparatus according to one aspect of the present invention includes an annular supporting part having an annular shape around a central axis directed in a vertical direction, for supporting an outer edge portion of a substrate in a horizontal state from below, a lower surface facing part having a facing surface which faces a lower surface of the substrate inside the annular supporting part, a rotating mechanism for rotating the annular supporting part together with the substrate around the central axis relatively to the lower surface facing part, a first processing liquid supply part for supplying a first processing liquid onto an upper surface of the substrate, a second processing liquid supply part for supplying a second processing liquid onto the lower surface of the substrate from a processing liquid nozzle provided at the lower surface facing part, and at least one gas ejection nozzle protruding from the facing surface, for ejecting heated gas toward the lower surface of the substrate. By the present invention, in the substrate processing apparatus in which the upper surface of the substrate is processed with the first processing liquid while the substrate is heated with heated gas ejected from the gas ejection nozzle, it is possible to perform a processing onto the lower surface of the substrate with the second processing liquid and further to suppress a flow of the second processing liquid into the gas ejection nozzle during the processing.

Preferably, the facing surface is a sloped surface which gets farther away from the substrate as a distance from the central axis becomes larger. It is thereby possible to easily guide the second processing liquid toward the outer side of the facing surface. Further, the at least one gas ejection nozzle includes a plurality of gas ejection nozzles, and a distance between an ejection port of one gas ejection nozzle out of the plurality of gas ejection nozzles and the central axis may be different from that between an ejection port of another gas ejection nozzle and the central axis. It is thereby possible to heat a wide range of the substrate.

The substrate processing apparatus according to another aspect of the present invention includes a sealed space forming part forming an internal space which is sealed, a sealed space opening and closing mechanism for moving a movable part which is part of the sealed space forming part relatively to the other portion, to thereby open and close the sealed space forming part, a substrate holding part disposed in the sealed space forming part, for holding a substrate in a horizontal state, a chemical liquid supply part for supplying a chemical liquid onto an upper surface of the substrate, an inert gas supply part for supplying an inert gas into the internal space, a gas exhaust part for exhausting gas from the internal space, and a control part for controlling the inert gas supply part to supply the inert gas into the internal space while controlling the gas exhaust part to exhaust gas from the internal space, to thereby bring the internal space which is sealed into an inert gas filled state, and for stopping supply of the inert gas into the internal space and exhaust of gas from the internal space when controlling the chemical liquid supply part to supply the chemical liquid onto the substrate in the inert gas filled state. By the substrate processing apparatus, it is possible to perform uniform processing onto the upper surface of the substrate.

Preferably, the substrate processing apparatus further includes a top plate extending along the upper surface so as to cover the substrate above the substrate, which goes close to the upper surface when the chemical liquid supply part supplies the chemical liquid onto the substrate, and a nozzle for supplying the chemical liquid from the chemical liquid supply part to between the top plate and the upper surface. It is thereby possible to perform more uniform processing onto the upper surface of the substrate.

Further, the control part may stop supply of the inert gas into the internal space and exhaust of gas from the internal space before starting supply of the chemical liquid onto substrate. It is thereby possible to more reliably block the flow of gas into/out of the internal space when the supply of the chemical liquid onto the substrate is started.

The present invention is also intended for a substrate processing method of processing a substrate in a substrate processing apparatus. In the substrate processing method according to the present invention, the substrate processing apparatus includes a sealed space forming part forming an internal space which is sealed, a sealed space opening and closing mechanism for moving a movable part which is part of the sealed space forming part relatively to the other portion, to thereby open and close the sealed space forming part, a substrate holding part disposed in the sealed space forming part, for holding a substrate in a horizontal state, a chemical liquid supply part for supplying a chemical liquid onto an upper surface of the substrate, an inert gas supply part for supplying an inert gas into the internal space, and a gas exhaust part for exhausting gas from the internal space, and the substrate processing method includes a) supplying the inert gas into the internal space by the inert gas supply part while exhausting gas from the internal space by the gas exhaust part, to thereby bring the internal space which is sealed into an inert gas filled state, and b) supplying the chemical liquid onto the substrate in the inert gas filled state by the chemical liquid supply part, and in the substrate processing method, supply of the inert gas into the internal space and exhaust of gas from the internal space are stopped when the chemical liquid is supplied onto the substrate in the operation b).

These and other objects, features, aspects and advantages of the present invention will become more apparent from the following detailed description of the present invention when taken in conjunction with the accompanying drawings.

DESCRIPTION OF EMBODIMENTS

Figure 1:
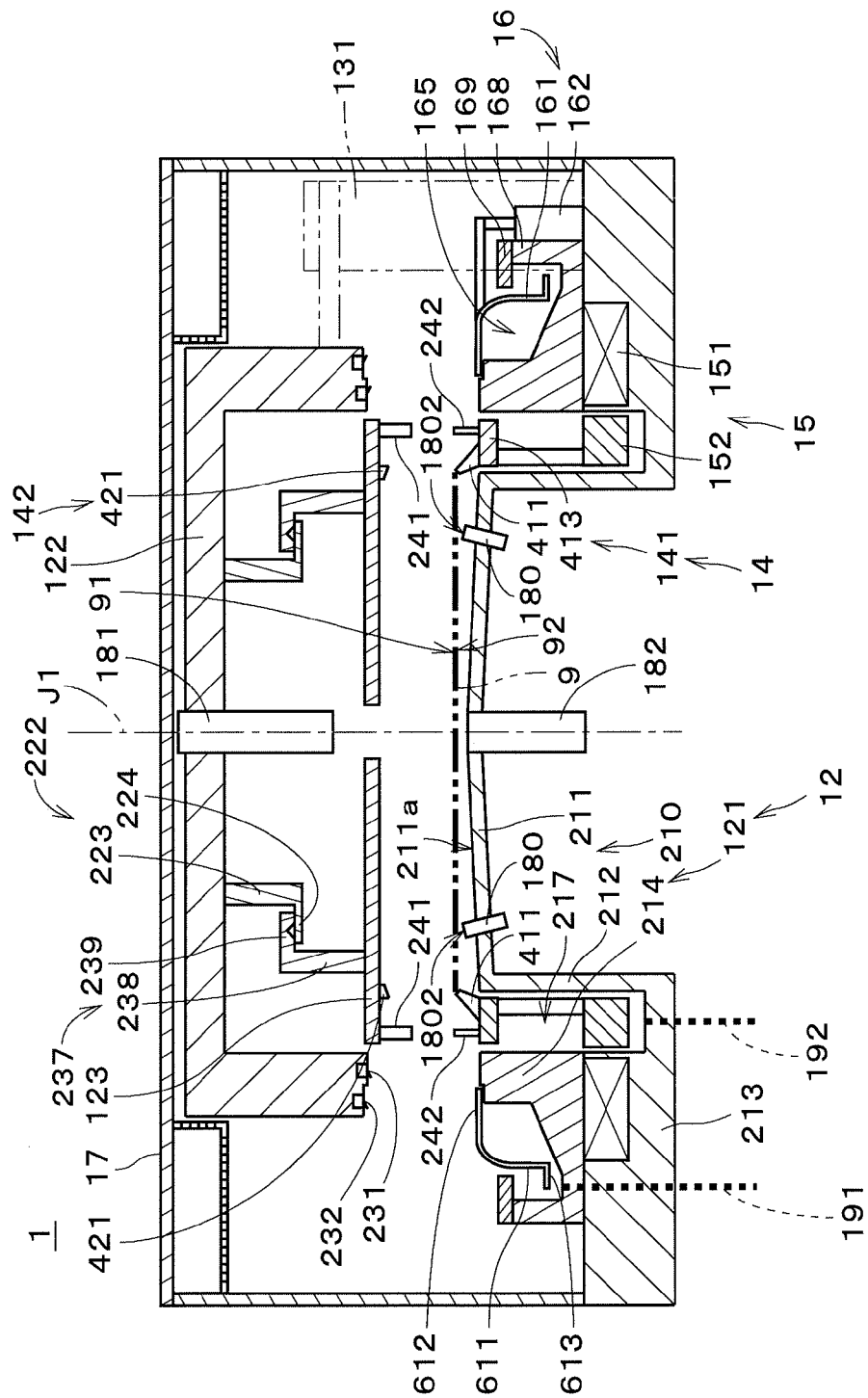
FIG. 1 is a cross-sectional view showing a substrate processing apparatus in accordance with a first preferred embodiment.

FIG. 1 is a cross-sectional view showing a substrate processing apparatus 1 in accordance with the first preferred embodiment of the present invention. The substrate processing apparatus 1 is a single-substrate processing apparatus for supplying a processing liquid to a semiconductor substrate 9 (hereinafter, referred to simply as a "substrate 9") having a substantially disk-like shape, to thereby process substrates 9 one by one. In FIG. 1, hatching of the cross sections of some constituent elements in the substrate processing apparatus 1 is omitted (the same applies to other cross-sectional views).

The substrate processing apparatus 1 includes a chamber 12, a top plate 123, a chamber opening and closing mechanism 131, a substrate holding part 14, a substrate rotating mechanism 15, a liquid receiving part 16, and a cover 17.

The chamber 12 includes a chamber body 121 and a chamber cover 122. The chamber body 121 and the chamber cover 122 are each formed of a non-magnetic material. The chamber body 121 includes a chamber bottom 210 and a chamber sidewall 214. The chamber bottom 210 includes a center portion 211 having a substantially disk-like shape, an inner sidewall 212 having a cylindrical shape extending downward from an outer edge portion of the center portion 211, and a base part 213 extending from the inner sidewall 212 outward in a radial direction. The chamber sidewall 214 has an annular shape around a central axis J1 directed in a vertical direction, protruding upward from a middle portion of the base part 213 in the radial direction. A member forming the chamber sidewall 214 also serves as part of the liquid receiving part 16, as described later. In the following description, a space surrounded by the chamber sidewall 214, the inner sidewall 212, and the base part 213 is referred to as a lower annular space 217. When the substrate 9 is supported by a substrate supporting part 141 (described later) of the substrate holding part 14, a lower surface 92 of the substrate 9 faces an upper surface 211a of the center portion 211. In the following description, the center portion 211 of the chamber bottom 210 is referred to as a "lower surface facing part 211", and the upper surface 211a of the center portion 211 is referred to as a "facing surface 211a". The detail of the lower surface facing part 211 will be described.

The chamber cover 122 has a substantially disk-like shape perpendicular to the central axis J1, including an upper portion of the chamber 12. The chamber cover 122 closes an upper opening of the chamber body 121. FIG. 1 shows a state where the chamber cover 122 is separated from the chamber body 121. When the chamber cover 122 closes the upper opening of the chamber body 121, an outer edge portion of the chamber cover 122 comes into contact with an upper portion of the chamber sidewall 214.

The chamber opening and closing mechanism 131 moves the chamber cover 122 which is a movable part of the chamber 12 relatively to the chamber body 121 which is the other portion of the chamber 12 in the vertical direction. The chamber opening and closing mechanism 131 serves as a cover up-and-down moving mechanism for moving the chamber cover 122 up and down. When the chamber opening and closing mechanism 131 moves the chamber cover 122 in the vertical direction, the top plate 123 is also moved, together with the chamber cover 122, in a certain range in the vertical direction. When the chamber cover 122 comes into contact with the chamber body 121 to close the upper opening thereof and the chamber cover 122 is pressed toward the chamber body 121, an internal space (see FIG. 4 described later) which is sealed is formed inside the chamber 12.

The substrate holding part 14 is disposed in the chamber 12 and holds the substrate 9 in a horizontal state. In other words, the substrate 9 is held by the substrate holding part 14, in a state where an upper surface 91 thereof is directed upward, being perpendicular to the central axis J1. The substrate holding part 14 includes the above-described substrate supporting part 141 for supporting an outer edge portion of the substrate 9 from below and a substrate retaining part 142 for retaining the outer edge portion of the substrate 9 from above, which is supported by the substrate supporting part 141. The substrate supporting part 141 includes a supporting part base 413 having a substantially annular disk-like shape around the central axis J1 and a plurality of first contact parts 411 fixed to an upper surface of the supporting part base 413. The substrate retaining part 142 includes a plurality of second contact parts 421 fixed to a lower surface of the top plate 123. Positions of the plurality of second contact parts 421 in a circumferential direction are actually different from those of the plurality of first contact parts 411 in the circumferential direction.

The top plate 123 has a substantially disk-like shape perpendicular to the central axis J1. The top plate 123 is disposed below the chamber cover 122 and above the substrate supporting part 141. The top plate 123 has an opening at its center portion. When the substrate 9 is supported by the substrate supporting part 141, the upper surface 91 of the substrate 9 faces the lower surface of the top plate 123 which is perpendicular to the central axis J1. A diameter of the top plate 123 is larger than that of the substrate 9, and an outer edge portion of the top plate 123 is positioned outer than the outer edge portion of the substrate 9 in the radial direction all around the circumference.

In the state of FIG. 1, the top plate 123 is supported by the chamber cover 122. In more detail, on a lower surface of the chamber cover 122, a plate holding part 222 having an annular shape is provided. The plate holding part 222 includes a cylindrical portion 223 having a substantially cylindrical shape around the central axis J1 and a flange portion 224 having a substantially annular shape around the central axis J1. The cylindrical portion 223 extends downward from the lower surface of the chamber cover 122. The flange portion 224 extends from a lower end of the cylindrical portion 223 outward in the radial direction.

The top plate 123 includes a held part 237 having an annular shape. The held part 237 includes a cylindrical portion 238 having a substantially cylindrical shape around the central axis J1 and a flange portion 239 having a substantially annular shape around the central axis J1. The cylindrical portion 238 extends upward from an upper surface of the top plate 123. The flange portion 239 extends from an upper end of the cylindrical portion 238 inward in the radial direction. The cylindrical portion 238 is positioned outer than the cylindrical portion 223 of the plate holding part 222 in the radial direction and faces the cylindrical portion 223 in the radial direction. The flange portion 239 is positioned above the flange portion 224 of the plate holding part 222 and faces the flange portion 224 in the vertical direction. When a lower surface of the flange portion 239 of the held part 237 comes into contact with an upper surface of the flange portion 224 of the plate holding part 222, the top plate 123 is attached to the chamber cover 122, being suspended from the chamber cover 122.

The substrate rotating mechanism 15 of FIG. 1 is a so-called hollow motor. The substrate rotating mechanism 15 includes a stator part 151 having an annular shape around the central axis J1 and a rotor part 152 having an annular shape. The rotor part 152 includes a permanent magnet having a substantially annular shape. A surface of the permanent magnet is molded of a PTFE (polytetrafluoroethylene) resin. The rotor part 152 is disposed inside the lower annular space 217 in the internal space of the chamber 12. Above the rotor part 152, attached is the supporting part base 413 of the substrate supporting part 141 with a connecting member interposed therebetween. The supporting part base 413 is disposed above the rotor part 152.

The stator part 151 is disposed in the periphery of the rotor part 152 outside the chamber 12 (in other words, outside the internal space), i.e., disposed outer in the radial direction. In the present preferred embodiment, the stator part 151 is fixed to the base part 213 and positioned below the liquid receiving part 16. The stator part 151 includes a plurality of coils arranged in the circumferential direction around the central axis J1.

By supplying current to the stator part 151, a rotating force is generated around the central axis J1 between the stator part 151 and the rotor part 152. The rotor part 152 is thereby rotated in a horizontal state around the central axis J1. With a magnetic force exerted between the stator part 151 and the rotor part 152, the rotor part 152 floats in the chamber 12, not being in direct or indirect contact with the chamber 12, and rotates the substrate 9, being in a floating state, together with the substrate supporting part 141 around the central axis J1.

The liquid receiving part 16 includes a cup part 161 and a cup moving mechanism 162. As described earlier, part of the member forming the chamber sidewall 214 is included in the liquid receiving part 16. The cup part 161 has an annular shape around the central axis J1 and is positioned outer than the chamber sidewall 214 in the radial direction. The cup moving mechanism 162 moves the cup part 161 in the vertical direction.

A lower portion of the cup part 161 is positioned inside a liquid receiving recessed portion 165 which has an annular shape and is positioned outer than the chamber sidewall 214. At an upper end portion of an outer wall 168 having a substantially cylindrical shape surrounding an outer periphery of the liquid receiving recessed portion 165, an outer seal part 169 having a substantially annular disk-like shape around the central axis J1 is fixed. The outer seal part 169 extends from the upper end portion of the outer wall 168 inward in the radial direction, to cover an outer peripheral portion of an upper opening of the liquid receiving recessed portion 165 all around the circumference.

An upper nozzle 181 is fixed to a center portion of the chamber cover 122. The upper nozzle 181 is insertable into the opening of the center portion of the top plate 123. At a center portion of the lower surface facing part 211 of the chamber bottom 210, a lower nozzle 182 is attached. At the lower surface facing part 211, a plurality of gas ejection nozzles 180 are further attached. A bottom portion of the liquid receiving recessed portion 165 is connected to a first exhaust path 191. A bottom portion of the lower annular space 217 between the inner sidewall 212 and the chamber sidewall 214 is connected to a second exhaust path 192. The positions for attachment of the upper nozzle 181 and the lower nozzle 182 are not necessarily limited to the center portion, but may be, for example, positions facing a peripheral portion of the substrate 9. Arrangement of the plurality of gas ejection nozzles 180 will be described later.

Figure 2:
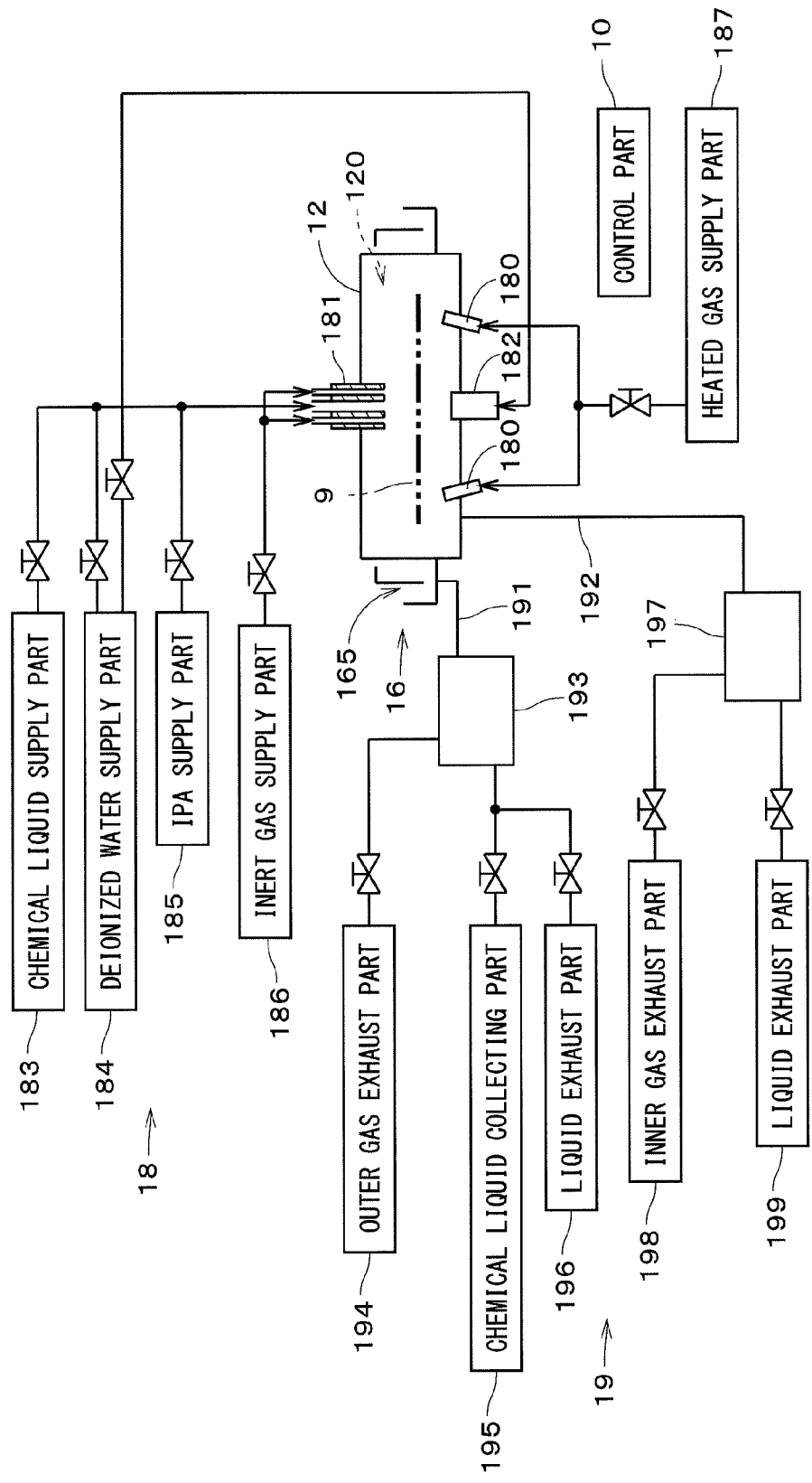
FIG. 2 is a block diagram showing a gas-liquid supply part and a gas-liquid exhaust part.

FIG. 2 is a block diagram showing a gas-liquid supply part 18 and a gas-liquid exhaust part 19 included in the substrate processing apparatus 1. The gas-liquid supply part 18 includes a chemical liquid supply part 183, a deionized water supply part 184, an IPA supply part 185, an inert gas supply part 186, and a heated gas supply part 187, besides the gas ejection nozzles 180, the upper nozzle 181, and the lower nozzle 182 described above. The chemical liquid supply part 183, the deionized water supply part 184, and the IPA supply part 185 are each connected to the upper nozzle 181 with a valve interposed therebetween. The lower nozzle 182 is connected to the deionized water supply part 184 with a valve interposed therebetween. The upper nozzle 181 is also connected to the inert gas supply part 186 with a valve interposed therebetween. The upper nozzle 181 has a liquid ejection port at its center portion and has a gas ejection (jet) port therearound. Therefore, exactly, part of the upper nozzle 181 is part of a gas supply part for supplying gas into the chamber 12 in a broad sense. The lower nozzle 182 has a liquid ejection port at its center portion. The plurality of gas ejection nozzles 180 are connected to the heated gas supply part 187 with a valve interposed therebetween.

The first exhaust path 191 connected to the liquid receiving recessed portion 165 of the liquid receiving part 16 is connected to a gas-liquid separating part 193. The gas-liquid separating part 193 is connected to an outer gas exhaust part 194, a chemical liquid collecting part 195, and a liquid exhaust (drain) part 196 each with a valve interposed therebetween. The second exhaust path 192 connected to the chamber bottom 210 is connected to a gas-liquid separating part 197. The gas-liquid separating part 197 is connected to an inner gas exhaust part 198 and a liquid exhaust part 199 each with a valve interposed therebetween. The constituent elements in the gas-liquid supply part 18 and the gas-liquid exhaust part 19 are controlled by a control part 10. The chamber opening and closing mechanism 131, the substrate rotating mechanism 15, and the cup moving mechanism 162 (see FIG. 1) are also controlled by the control part 10.

In the present preferred embodiment, a chemical liquid supplied from the chemical liquid supply part 183 onto the substrate 9 through the upper nozzle 181 is an etching solution such as hydrofluoric acid, a tetramethylammonium hydroxide solution, or the like. The deionized water supply part 184 supplies deionized water (DIW) onto the substrate 9 through the upper nozzle 181 or the lower nozzle 182. The IPA supply part 185 supplies isopropyl alcohol (IPA) onto the substrate 9 through the upper nozzle 181. In the substrate processing apparatus 1, a processing liquid supply part for supplying any processing liquid other than the above processing liquids may be provided. Further, the inert gas supply part 186 supplies an inert gas into the chamber 12 through the upper nozzle 181. The heated gas supply part 187 supplies heated gas (e.g., a high-temperature inert gas heated up to 120 to 130 degrees C.) onto the lower surface 92 of the substrate 9 through the plurality of gas ejection nozzles 180. In the present preferred embodiment, the gas used in the inert gas supply part 186 and the heated gas supply part 187 is nitrogen gas ($N_2$), but any gas other than nitrogen gas may be used. In the case where the heated inert gas is used in the heated gas supply part 187, the explosion-proof countermeasure in the substrate processing apparatus 1 can be simplified or is not needed.

As shown in FIG. 1, the cup part 161 includes a sidewall 611, an upper surface part 612, and a lower surface part 613. The sidewall 611 has a substantially cylindrical shape around the central axis J1. The upper surface part 612 has a substantially annular disk-like shape around the central axis J1, extending from an upper end portion of the sidewall 611 inward in the radial direction. The lower surface part 613 has substantially annular disk-like shape around the central axis J1, extending from a lower end portion of the sidewall 611 outward in the radial direction. The upper surface part 612 and the lower surface part 613 are substantially perpendicular to the central axis J1. In the state of FIG. 1, almost the whole of the sidewall 611 and the lower surface part 613 in the cup part 161 are positioned inside the liquid receiving recessed portion 165.

Figure 3:
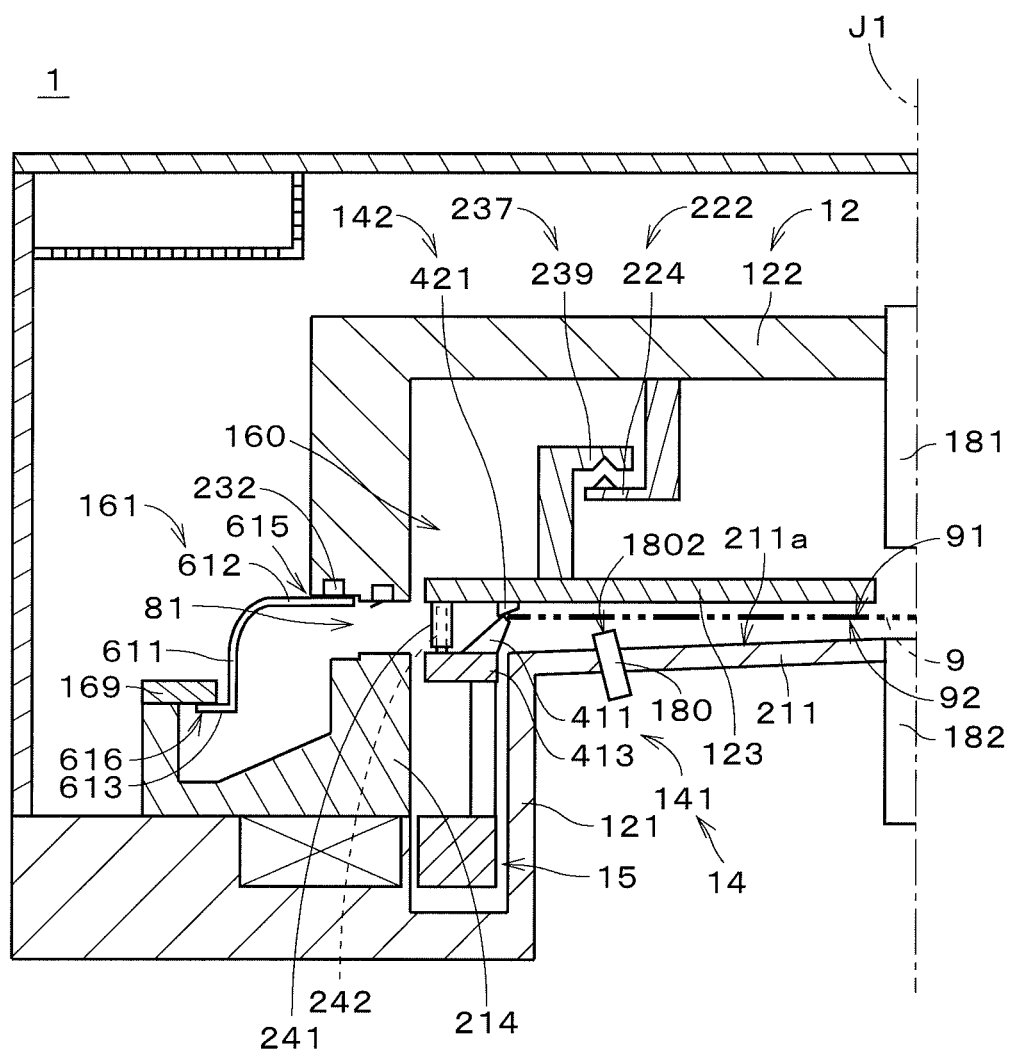
FIGS. 3 and 4 are cross-sectional views each showing part of the substrate processing apparatus.

On a lower surface of an outer edge portion of the chamber cover 122, provided are lip seals 231 and 232 each having an annular shape. The lip seal 231 is positioned above an upper end portion of the chamber sidewall 214. The lip seal 232 is positioned above an inner edge portion of the upper surface part 612 of the cup part 161. When the chamber cover 122 shown in FIG. 1 moves down and the cup part 161 moves up, as shown in FIG. 3, the lip seal 232 comes into contact with the inner edge portion of the upper surface part 612 of the cup part 161 in the vertical direction. Further, when the chamber cover 122 moves down to the chamber sidewall 214, as shown in FIG. 4, the lip seal 231 comes into contact with the upper end portion of the chamber sidewall 214 in the vertical direction.

As shown in FIG. 1, on a lower surface of an outer edge portion of the top plate 123, a plurality of first engagement parts 241 are arranged in the circumferential direction, and on an upper surface of the supporting part base 413, a plurality of second engagement parts 242 are arranged in the circumferential direction. It is preferable that these engagement parts should be provided in three or more pairs, and in the present preferred embodiment, four pairs are provided. At a lower portion of the first engagement part 241, provided is a recessed portion which is recessed upward. The second engagement part 242 protrudes upward from the supporting part base 413.

Figure 4:
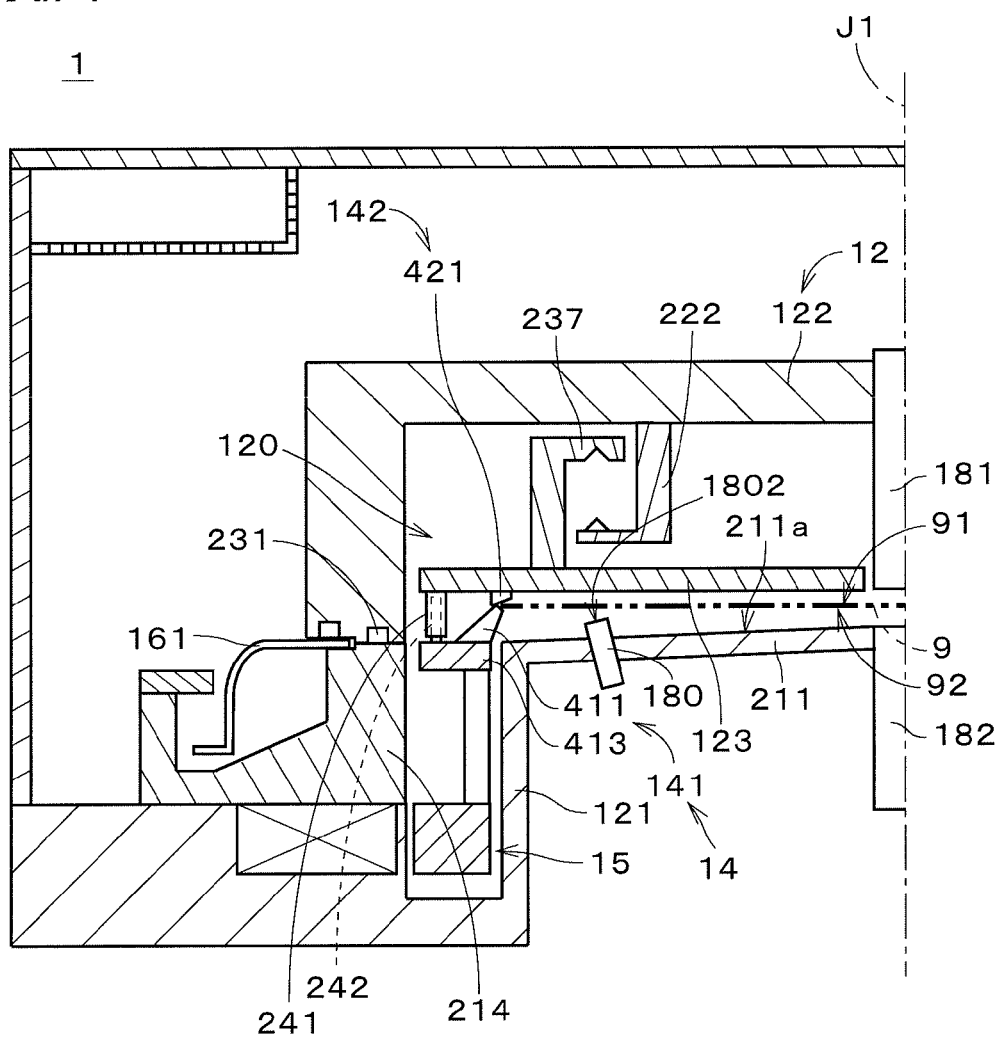

When the chamber cover 122 moves down, as shown in FIGS. 3 and 4, the second engagement part 242 engages with the recessed portion of the first engagement part 241. The top plate 123 thereby engages with the supporting part base 413 of the substrate supporting part 141 in the circumferential direction around the central axis J1. In other words, the first engagement part 241 and the second engagement part 242 serve as a position regulating member for regulating a relative position of the top plate 123 with respect to the substrate supporting part 141 in a rotation direction (for fixing the relative position in the circumferential direction). When the chamber cover 122 moves down, the substrate rotating mechanism 15 controls a rotation position of the supporting part base 413 so that the first engagement part 241 may engage with the second engagement part 242. Further, in the states of FIGS. 3 and 4, the plate holding part 222 releases holding of the top plate 123.

As described earlier, on the upper surface of the supporting part base 413 shown in FIG. 1, the plurality of first contact parts 411 of the substrate supporting part 141 are arranged in the circumferential direction. The plurality of first contact parts 411 are disposed inner than the plurality of second engagement parts 242 in the radial direction. Further, on the lower surface of the outer edge portion of the top plate 123, the plurality of second contact parts 421 of the substrate retaining part 142 are arranged in the circumferential direction. The second contact parts 421 are disposed inner than the plurality of first engagement parts 241 in the radial direction. As described above, the positions of the plurality of second contact parts 421 in the circumferential direction are different from those of the plurality of first contact parts 411 in the circumferential direction. In the present preferred embodiment, four first contact parts 411 are arranged at regular angular intervals in the circumferential direction. Further, in the circumferential direction, two second contact parts 421 are disposed adjacently on both sides of each first contact part 411, and assuming that the two second contact parts 421 adjacent to one first contact part 411 are regarded as one pair, four pairs of second contact parts 421 are disposed at regular angular intervals in the circumferential direction. As shown in FIGS. 3 and 4, in the state where the chamber cover 122 is positioned down, the plurality of second contact parts 421 of the substrate retaining part 142 are in contact with the outer edge portion of the substrate 9.

On the lower surface of the top plate 123 and on the supporting part base 413 of the substrate supporting part 141, provided are a plurality of pairs of magnets (not shown) in each of which two magnets face each other in the vertical direction. Hereinafter, each pair of magnets is referred to also as "a magnet pair". In the substrate processing apparatus 1, a plurality of magnet pairs are disposed at regular angular intervals at positions different from those of the first contact parts 411, the second contact parts 421, the first engagement parts 241, and the second engagement parts 242 in the circumferential direction. In a state where the substrate retaining part 142 is in contact with the substrate 9, with a magnetic force (attractive force) exerted between each magnet pair, a downward force is exerted on the top plate 123. The substrate retaining part 142 thereby presses the substrate 9 toward the substrate supporting part 141.

In the substrate processing apparatus 1, the substrate retaining part 142 presses the substrate 9 toward the substrate supporting part 141 with the weight of the top plate 123 and the magnetic forces of the magnet pairs, and it is thereby possible to strongly hold the substrate 9 being sandwiched from above and below by the substrate retaining part 142 and the substrate supporting part 141. In the states shown in FIGS. 3 and 4, the plate holding part 222 is out of contact with the held part 237, and the top plate 123, being independent from the chamber cover 122, is rotated by the substrate rotating mechanism 15, together with the substrate holding part 14 and the substrate 9 held by the substrate holding part 14.

Figure 5:
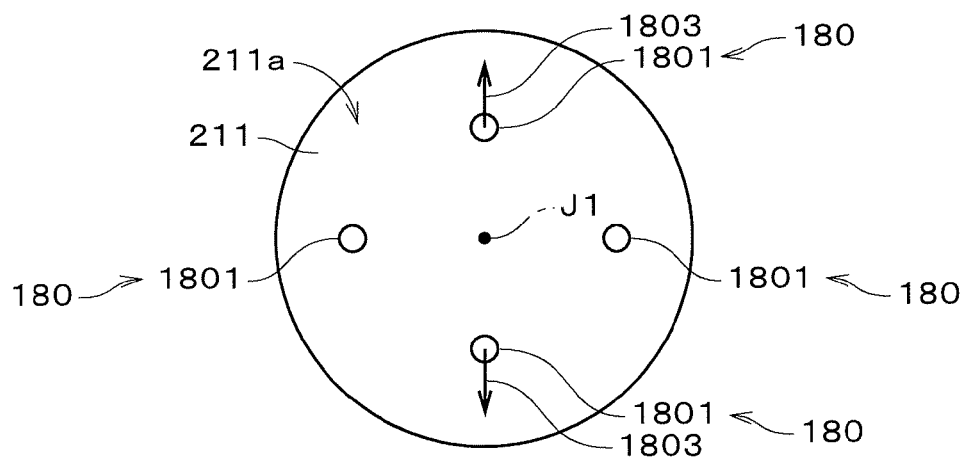
FIG. 5 is a view showing an arrangement of gas ejection nozzles in a lower surface facing part.

FIG. 5 is a view showing an arrangement of the plurality of gas ejection nozzles 180 in the lower surface facing part 211 of the chamber bottom 210. In FIG. 5, an attachment position of each gas ejection nozzle 180 in the lower surface facing part 211 is represented by a solid-line circle with reference number "1801" (the same applies to FIGS. 8 and 9).

As shown in FIG. 5, four gas ejection nozzles 180 are provided in the lower surface facing part 211. In more detail, the four gas ejection nozzles 180 are disposed at regular angular intervals (at intervals of 90 degrees in FIG. 5) in the circumferential direction around the central axis J1. Assuming that two gas ejection nozzles 180 which face each other with the central axis J1 interposed therebetween, i.e., two gas ejection nozzles 180 which are disposed at intervals of 180 degrees in the circumferential direction are referred to as a "nozzle pair", in FIG. 5, two nozzle pairs are provided. In each nozzle pair, a distance between an ejection port of one gas ejection nozzle and the central axis J1 (hereinafter, referred to as an "ejection port-central axis distance") and that between an ejection port of the other gas ejection nozzle and the central axis J1 are equal to each other. Further, an ejection port-central axis distance of one nozzle pair is different from that of the other nozzle pair. For example, in the substrate processing apparatus 1 used for processing a substrate 9 having a radius of about 150 mm, an ejection port-central axis distance of one nozzle pair is 110 mm and that of the other nozzle pair is 145 mm.

As described earlier, when the substrate 9 is supported by the substrate supporting part 141 shown in FIG. 1, the facing surface 211a of the lower surface facing part 211 faces the lower surface 92 of the substrate 9. The facing surface 211a is a sloped surface which goes downward as a distance from the central axis J1 becomes larger, extending almost entirely over the lower surface 92 of the substrate 9. A distance between the facing surface 211a and the lower surface 92 of the substrate 9 becomes minimum near the lower nozzle 182, e.g., 5 mm. Further, the distance becomes maximum at the outer edge portion of the substrate 9, e.g., 30 mm. The plurality of gas ejection nozzles 180 protrude from the facing surface 211a and the respective ejection ports 1802 are positioned upper than the facing surface 211a.

The gas ejection nozzles 180 of the nozzle pair disposed left and right of the central axis J1 in FIG. 5 (i.e., the gas ejection nozzles 180 to which the arrows 1803 are not given) are each fixed to the lower surface facing part 211 so that its central axis may extend almost along the normal of the facing surface 211a at the attachment position 1801. Therefore, these gas ejection nozzles 180 are each inclined with respect to the central axis J1 so that the ejection port 1802 may be positioned slightly outer than the attachment position 1801. Further, the gas ejection nozzles 180 of the nozzle pair disposed upper and lower than the central axis J1 in FIG. 5 are each fixed to the lower surface facing part 211, being inclined so that the ejection port 1802 thereof may be positioned outer than the normal of the facing surface 211a at the attachment position 1801 (on the opposite side of the central axis J1) (see the arrow 1803). Thus, any gas ejection nozzle 180 in the substrate processing apparatus 1 is inclined with respect to the central axis J1 with the ejection port 1802 thereof directed upper and slightly outward.

As shown in FIG. 1, the ejection port 1802 of the gas ejection nozzle 180 is close to the lower surface 92 of the substrate 9. From the viewpoint of effective heating of the substrate 9, a distance between an upper end of the gas ejection nozzle 180 and the lower surface 92 of the substrate 9 in a direction of the central axis J1 is preferably not larger than 8 mm, and more preferably not larger than 5 mm (the same applies to the gas ejection nozzles 180 of FIGS. 8 and 9 described later). Further, in order to avoid any contact between the gas ejection nozzle 180 and the lower surface 92 of the substrate 9, the distance between the upper end of the gas ejection nozzle 180 and the lower surface 92 of the substrate 9 is preferably not smaller than 2 mm.

Figure 6:
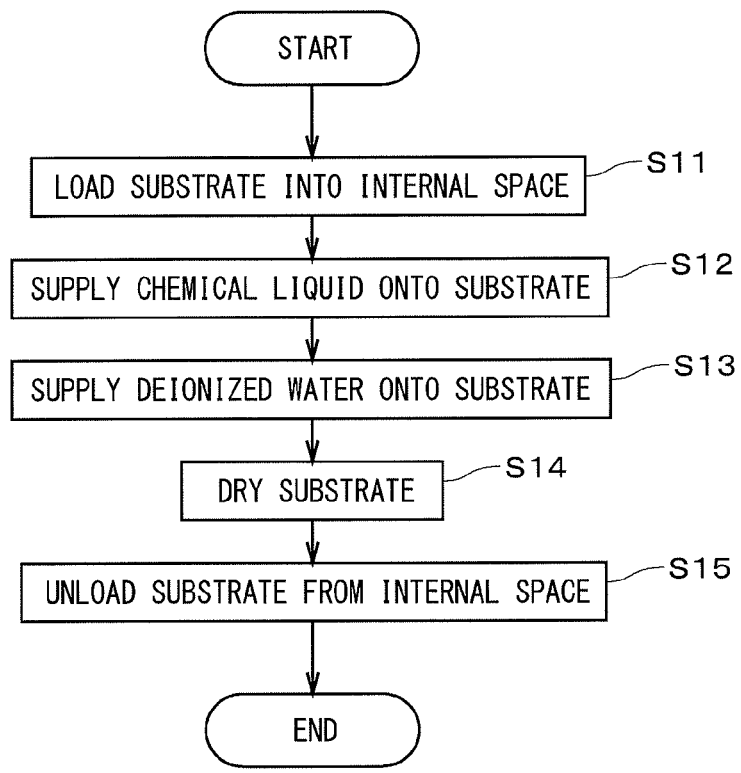
FIG. 6 is a flowchart showing an operation flow of the substrate processing apparatus.

FIG. 6 is a flowchart showing an operation flow for processing the substrate 9 in the substrate processing apparatus 1. In the substrate processing apparatus 1, first, in a state where the chamber cover 122 is positioned upper as shown in FIG. 1, the substrate 9 is loaded into the internal space of the chamber 12 by an external transfer mechanism and supported by the substrate supporting part 141 from below (Step S11). Subsequently, when the chamber cover 122 moves down to the position shown in FIG. 3, the substrate 9 is held by the substrate retaining part 142 and the substrate supporting part 141. At that time, the chamber cover 122 and the chamber sidewall 214 are separated from each other, and an annular opening 81 is formed between the chamber cover 122 and the chamber sidewall 214 around the substrate 9 (in other words, outer than the substrate 9 in the radial direction). Hereinafter, a state of the chamber 12 where the annular opening 81 is formed is referred to as a "semiopen state". Further, the state of FIG. 1 is referred to as an "open state".

The cup part 161 moves upward from the position shown in FIG. 1, to be positioned outer than the annular opening 81 in the radial direction all around the circumference, as shown in FIG. 3. Thus, the cup moving mechanism 162 (see FIG. 1) moves the cup part 161 between a first position which is outer than the annular opening 81 in the radial direction and a second position below the first position (see FIG. 1) in the vertical direction. In the cup part 161 positioned at the first position, the sidewall 611 faces the annular opening 81 in the radial direction.

In the cup part 161 positioned at the first position, an upper surface of the inner edge portion of the upper surface part 612 is in contact with the lip seal 232 of the chamber cover 122 all around the circumference. With this contact, between the chamber cover 122 and the upper surface part 612 of the cup part 161, formed is a first seal 615 for preventing the passage of gas and/or liquid. Further, an upper surface of the lower surface part 613 of the cup part 161 is in contact with a lower surface of the outer seal part 169 of the chamber body 121 all around the circumference. With this contact, between the chamber body 121 and the lower surface part 613 of the cup part 161, formed is a second seal 616 for preventing the passage of gas and/or liquid.

In the substrate processing apparatus 1, the upper surface part 612 of the cup part 161 serves as a first seal part which forms the first seal 615 at the first position, and the lower surface part 613 thereof serves as a second seal part which forms the second seal 616 at the first position. Then, the chamber 12 in the semiopen state (in other words, the chamber body 121 and the chamber cover 122 in the state where the annular opening 81 is formed) and the cup part 161 positioned at the first position form a sealed internal space 160 (hereinafter, referred to as a "sealed space 160"). Thus, in the substrate processing apparatus 1, a sealed space forming part which forms the sealed space 160 is achieved by the chamber 12 and the cup part 161.

After the sealed space 160 is formed, rotation of the substrate 9 is started by the substrate rotating mechanism 15 at a constant number of rotation (relatively low number of rotation (rotation speed), and hereinafter, referred to as "the steady number of rotation"). Further, the supply of the inert gas (herein, nitrogen gas) from the inert gas supply part 186 (see FIG. 2) into the sealed space 160 is started, and the exhaust of gas from the sealed space 160 by the outer gas exhaust part 194 is also started. After a predetermined time elapses, the sealed space 160 is thereby brought into an inert gas filled state where the inert gas is filled therein (in other words, into a low oxygen atmosphere where the oxygen concentration is low). Further, the supply of the inert gas into the sealed space 160 and the exhaust of the gas from the sealed space 160 may be performed in the open state shown in FIG. 1.

Subsequently, the supply of the chemical liquid onto the upper surface 91 of the substrate 9 is started by the chemical liquid supply part 183 (Step S12). As shown in FIG. 3, the chemical liquid from the chemical liquid supply part 183 is gently and continuously supplied onto the center portion of the upper surface 91 of the substrate 9 from the upper nozzle 181 through the opening of the center portion of the top plate 123. With the rotation of the substrate 9, the chemical liquid spreads toward the outer peripheral portion and the entire upper surface 91 is thereby covered with the chemical liquid.

At that time, heated gas is ejected from the plurality of gas ejection nozzles 180 toward the lower surface 92 of the substrate 9. While the vicinity of a radius position of the substrate 9 corresponding to the ejection port-central axis distance of each nozzle pair is thereby uniformly heated all around the circumference, etching is performed on the upper surface 91 by using the chemical liquid. In an actual case, since the lower surface of the top plate 123 is close to the upper surface 91 of the substrate 9, the etching of the substrate 9 is performed in a very narrow space between the lower surface of the top plate 123 and the upper surface 91.

In the sealed space 160, the chemical liquid scattered from the upper surface 91 of the substrate 9 is received by the cup part 161 through the annular opening 81 and flows into the gas-liquid separating part 193 through the first exhaust path 191 shown in FIG. 2. In the chemical liquid collecting part 195, the chemical liquid is collected from the gas-liquid separating part 193, and after removing impurities or the like from the chemical liquid through a filter or the like, the chemical liquid is reused.

After a predetermined time (e.g., 60 to 120 seconds) elapses from the start of the supply of the chemical liquid, the supply of the chemical liquid from the chemical liquid supply part 183 and the supply of the heated gas from the heated gas supply part 187 are stopped. Subsequently, the substrate rotating mechanism 15 increases the number of rotation of the substrate 9 to be higher than the steady number of rotation for a predetermined time period (e.g., 1 to 3 seconds), to thereby remove the chemical liquid from the substrate 9. At that time, since the top plate 123 is rotated together with the substrate supporting part 141, almost no chemical liquid remains on the lower surface of the top plate 123 and therefore, the chemical liquid never drops from the top plate 123.

After the number of rotation of the substrate 9 is decreased to the steady number of rotation, as shown in FIG.

4, the chamber cover 122 and the cup part 161 move down. Then, the lip seal 231 of the chamber cover 122 comes into contact with the upper portion of the chamber sidewall 214, and the chamber 12 thereby forms a sealed internal space 120 (hereinafter, referred to as a "sealed space 120") therein. In a state where the chamber 12 is sealed, the substrate 9 directly faces an inner wall of the chamber 12 and there exists no other liquid receiving part therebetween. After that, the exhaust of the gas by the outer gas exhaust part 194 is stopped and the exhaust of gas from the sealed space 120 by the inner gas exhaust part 198 is started. Then, the supply of the deionized water serving as a rinse liquid or a cleaning solution onto the substrate 9 is started by the deionized water supply part 184 (Step S13).

The deionized water (pure water) from the deionized water supply part 184 is ejected from the upper nozzle 181 and the lower nozzle 182 and continuously supplied onto the respective center portions of the upper surface 91 and the lower surface 92 of the substrate 9. With the rotation of the substrate 9, the deionized water spreads toward the respective outer peripheral portions of the upper surface 91 and the lower surface 92 and is scattered outward from an outer peripheral edge of the substrate 9. The deionized water scattered from the substrate 9 is received by the inner wall of the chamber 12 (i.e., the respective inner walls of the chamber cover 122 and the chamber sidewall 214) and discarded through the second exhaust path 192, the gas-liquid separating part 197, and the liquid exhaust part 199 shown in FIG. 2 (the same applies to drying of the substrate 9 described later). With this operation, as well as a rinse process of the upper surface 91 of the substrate 9 and a cleaning process of the lower surface 92 thereof, cleaning of the inside of the chamber 12 is substantially performed.

After a predetermined time elapses from the start of supply of the deionized water, the supply of the deionized water from the deionized water supply part 184 is stopped. Then, in the sealed space 120, the number of rotation of the substrate 9 is increased to be sufficiently higher than the steady number of rotation. The deionized water is thereby removed from the substrate 9, and drying of the substrate 9 is performed (Step 14). After a predetermined time elapses from the start of drying of the substrate 9, the rotation of the substrate 9 is stopped.

After that, the chamber cover 122 and the top plate 123 move up, and the chamber 12 is brought into the open state as shown in FIG. 1. In Step S14, since the top plate 123 is rotated together with the substrate supporting part 141, almost no liquid remains on the lower surface of the top plate 123 and therefore, no liquid drops from the top plate 123 onto the substrate 9 when the chamber cover 122 moves up. The substrate 9 is unloaded from the internal space of the chamber 12 by the external transfer mechanism (Step S15). Further, after the deionized water supply part 184 supplies the deionized water and before the substrate 9 is dried, the IPA supply part 185 may supply the IPA onto the substrate 9, to thereby replace the deionized water with the IPA on the substrate 9.

As described above, in the substrate processing apparatus 1, the outer edge portion of the substrate 9 in the horizontal state is supported from below by the substrate supporting part 141 which is an annular supporting part, and the lower surface facing part 211 having the facing surface 211a which faces the lower surface 92 of the substrate 9 is provided on the inner side of the substrate supporting part 141. Then, the gas ejection nozzles 180 for ejecting heated gas toward the lower surface 92 of the substrate 9 is provided on the lower surface facing part 211.

Figure 7:
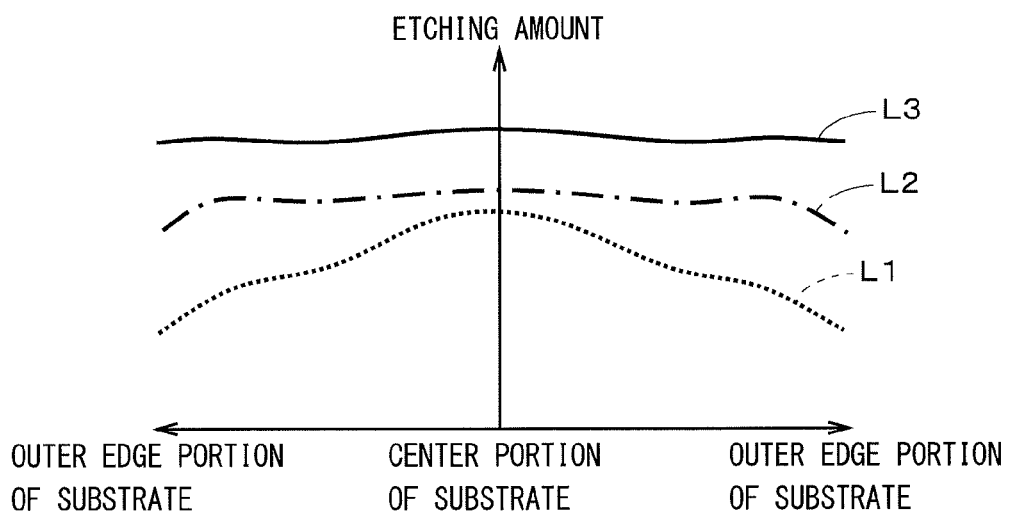
FIG. 7 is a graph showing an experimental result on etching.

Herein, explanation will be made on a difference in the uniformity of the processing of the substrate 9 due to whether or not the lower surface 92 of the substrate 9 is heated by the gas ejection nozzles 180. FIG. 7 is a graph showing an experimental result on etching. In FIG. 7, the horizontal axis represents a position on the substrate 9 in the radial direction and the vertical axis represents an etching amount. Further, in FIG. 7, the etching amount at each position in a case where the lower surface 92 of the substrate 9 is not heated (this case may be thought as a case where the gas ejection nozzles 180 are omitted) is indicated by the broken line L1, and the etching amount at each position in a case where the lower surface 92 of the substrate 9 is heated is indicated by the one-dot chain line L2. Further, the solid line L3 indicates a change in the etching amount in an exemplary case of FIG. 8 described later.

As shown in FIG. 7, in the case where the lower surface 92 is not heated, the etching amount becomes low at the outer edge portions of the substrate 9. On the other hand, in the case where the lower surface 92 is heated, the decrease in the etching amount at the outer edge portions of the substrate 9 is suppressed. When a value indicating the uniformity is obtained by ((A−B)/2C*100) by using a maximum value A, a minimum value B, and an average value C of the etching amount at a plurality of positions on the substrate 9, the uniformity of etching in the case where the lower surface 92 is not heated is 7%. On the other hand, the uniformity of etching in the case where the lower surface 92 is heated is 3%, and the uniformity is improved in this case.

Thus, in the substrate processing apparatus 1, when the upper surface 91 of the substrate 9 is processed with a processing liquid ejected from the upper nozzle 181, by heating the substrate 9 with heated gas ejected from the gas ejection nozzles 180 (preferably, by heating a portion away from the central axis J1, where the temperature is relatively low), it is possible to improve the uniformity of a temperature distribution of the substrate 9. As a result, it is possible to improve the uniformity of the processing on the upper surface 91 of the substrate 9 with a processing liquid from the upper nozzle 181.

Further, by providing the lower nozzle 182 for ejecting the deionized water as a processing liquid on the lower surface facing part 211 as a processing liquid nozzle, it is possible to perform the processing of the lower surface 92 of the substrate 9 with this processing liquid. Furthermore, since the gas ejection nozzles 180 protrude from the facing surface 211a of the lower surface facing part 211, it is possible to suppress the flow of the processing liquid into the gas ejection nozzles 180 through the ejection ports 1802 during the processing of the lower surface 92 of the substrate 9.

In the substrate processing apparatus 1, since the gas ejection nozzles 180 are inclined with respect to the central axis J1, it is possible to further suppress the flow of the processing liquid into the gas ejection nozzles 180. Further, since the distance between the gas ejection nozzle 180 and the lower surface 92 of the substrate 9 is not larger than 8 mm in the direction of the central axis J1, it is possible to efficiently heat the substrate 9. Furthermore, since the distance between the ejection port 1802 of one gas ejection nozzle 180 out of the plurality of gas ejection nozzles 180 and the central axis J1 is different from that between the ejection port 1802 of another gas ejection nozzle 180 and the central axis J1, it is possible to heat a wide range of the substrate 9.

Since the facing surface 211a is a sloped surface which gets farther away from the substrate 9 as a distance from the central axis J1 becomes larger, it is possible to easily guide the processing liquid used for the processing of the lower surface 92 of the substrate 9 toward the outer side of the facing surface 211a. As a result, it is also possible to prevent the processing liquid from being accumulated on the facing surface 211a. Further, depending on the design of the substrate processing apparatus 1, the facing surface 211a may be a surface in parallel with the lower surface 92 of the substrate 9.

Assuming that a substrate processing apparatus in which a substrate is processed in an open processing space is considered as a comparative example, in the comparative example of substrate processing apparatus, in order to prevent gas containing a chemical liquid component from being diffused outside, the gas in the processing space is exhausted in a large flow during the processing of the substrate with the processing liquid. Further, in order to prevent deposition of particles on the substrate, a downflow is sometimes formed. Therefore, an airflow from upper toward lower is formed around the substrate, and a temperature of the substrate becomes easy to decrease due to the airflow. The decrease in the temperature of the substrate becomes more remarkable at an outer edge portion of the substrate, and the uniformity of the temperature distribution of the substrate is deteriorated. As a result, the uniformity of the processing of the substrate by using the chemical liquid is deteriorated (in other words, the percent value indicating the uniformity increases). Though it may be possible to suppress deterioration in the uniformity of the temperature distribution of the substrate by supplying the chemical liquid which is heated to a certain temperature onto the substrate in a large flow, the amount of chemical liquid consumed disadvantageously increases.

On the other hand, in the substrate processing apparatus 1, since the sealed space 160 which is smaller than the processing space in the comparative example of substrate processing apparatus is formed by the chamber 12 and the cup part 161 which serve as the sealed space forming part, it is possible to suppress diffusion of heat from the substrate 9. In an actual case, when the chemical liquid is supplied onto the substrate 9 by the chemical liquid supply part 183, the top plate 123 becomes close to the upper surface 91 of the substrate 9. The lower surface facing part 211 is close to the lower surface 92 of the substrate 9. It is thereby possible to further suppress the diffusion of heat from the substrate 9.

In the substrate processing apparatus 1 in which the sealed space 160 is formed, since no gas containing a chemical liquid component diffuses outside and there is low necessity of the downflow which is formed in order to prevent deposition of particles on the substrate, it is possible to set the amount of gas flowing into the sealed space 160 and the amount of gas flowing out of the sealed space 160 low. Therefore, it is possible to further reduce the decrease in the temperature of the substrate 9. As a result, it is possible to improve the uniformity of the temperature distribution of the substrate while setting the flow rate of heated gas from the gas ejection nozzles 180 relatively low. Further, since it is not necessary to supply the chemical liquid which is heated to a certain temperature onto the substrate 9 in a large flow (in other words, it is possible to reduce the amount of chemical liquid consumed), it is possible to also reduce the COO (Cost Of Ownership) of the substrate processing apparatus 1.

In the substrate processing apparatus 1, in the processing using the chemical liquid, the sealed space 160 is brought into an inert gas filled state (i.e., a low oxygen atmosphere) and further, the heated inert gas is ejected from the gas ejection nozzles 180. It thereby becomes possible to use not only an inorganic chemical liquid but also a flammable organic chemical liquid or the like, and the explosion-proof countermeasure becomes easy.

Figure 8:
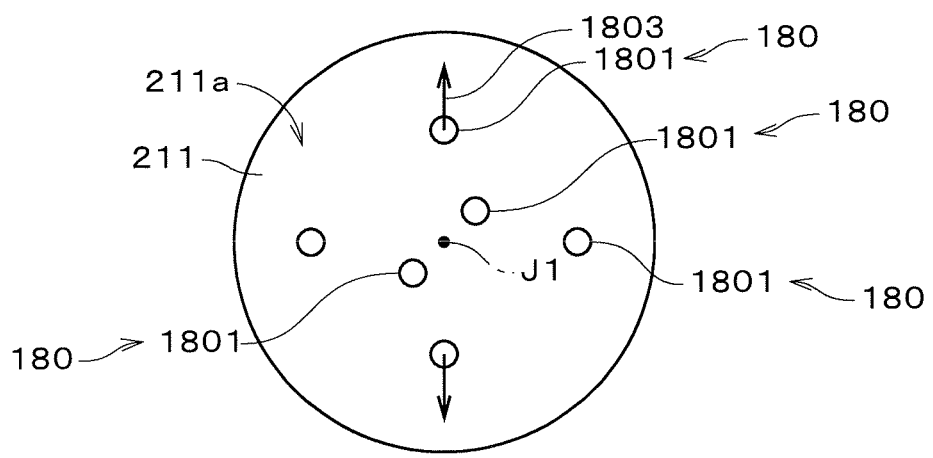
FIG. 8 is a view showing another exemplary arrangement of the gas ejection nozzles in the lower surface facing part.

FIG. 8 is a view showing another exemplary arrangement of the plurality of gas ejection nozzles 180 in the lower surface facing part 211. On the lower surface facing part 211 shown in FIG. 8, provided are six gas ejection nozzles 180 each protruding from the facing surface 211a. In more detail, four gas ejection nozzles 180 among the six gas ejection nozzles 180 are arranged in the same manner as the four gas ejection nozzles 180 shown in FIG. 5 are arranged. The other two gas ejection nozzles 180 are arranged near the central axis J1 at intervals of 180 degrees in the circumferential direction. Thus, in FIG. 8, three nozzle pairs are provided, and the respective ejection port-central axis distances of the three nozzle pairs are different from one another. In the substrate processing apparatus 1 used for processing the substrate 9 having a radius of about 150 mm, for example, the ejection port-central axis distance of one nozzle pair is 110 mm, the ejection port-central axis distance of another nozzle pair is 145 mm, and the ejection port-central axis distance of the other nozzle pair is smaller than 110 mm.

The facing surface 211a is a sloped surface which goes downward as a distance from the central axis J1 becomes larger and all the gas ejection nozzles 180 are each inclined with respect to the central axis J1 (the same applies to still another example of FIG. 9 described later). As indicated by the solid line L3 in FIG. 7, in the exemplary arrangement of FIG. 8 as compared with the exemplary arrangement of FIG. 5, the decrease in the etching amount at the outer edge portions of the substrate 9 is further suppressed, and the uniformity of the etching process is 1%.

Figure 9:
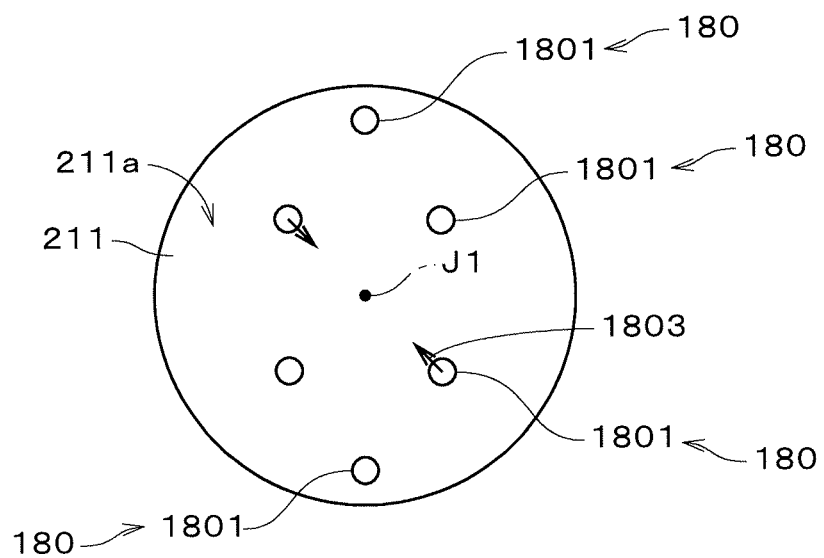
FIG. 9 is a view showing still another exemplary arrangement of the gas ejection nozzles in the lower surface facing part.

FIG. 9 is a view showing still another exemplary arrangement of the plurality of gas ejection nozzles 180 in the lower surface facing part 211. In FIG. 9, three nozzle pairs are provided, and the respective ejection port-central axis distances of the three nozzle pairs are different from one another. In the substrate processing apparatus 1 used for processing the substrate 9 having a radius of about 150 mm, for example, the ejection port-central axis distance of one nozzle pair is 65 mm, the ejection port-central axis distance of another nozzle pair is 90 mm, and the ejection port-central axis distance of the other nozzle pair is 145 mm.

In an actual case, the gas ejection nozzles 180 of the nozzle pair having the minimum ejection port-central axis distance are each fixed to the lower surface facing part 211, being inclined so that the ejection port 1802 thereof may be positioned inner than the attachment position 1801 (see the arrow 1803). In the gas ejection nozzle 180, the ejection port 1802 thereof is directed upper and slightly inward. The other gas ejection nozzles 180 are each fixed to the lower surface facing part 211 almost along the normal of the facing surface 211a which is a sloped surface. Also in the exemplary arrangement of FIG. 9, the uniformity of the processing on the upper surface 91 of the substrate 9 can be improved.

The above-described substrate processing apparatus 1 allows various variations. Assuming that the processing liquid supplied onto the upper surface 91 of the substrate 9 is a first processing liquid, though the chemical liquid is supplied onto the upper surface 91 as the first processing liquid from the chemical liquid supply part 183 which is a first processing liquid supply part in the above-described substrate processing apparatus 1, the first processing liquid may be a processing liquid other than the chemical liquid. Similarly, assuming that the processing liquid supplied onto the lower surface 92 of the substrate 9 is a second processing liquid, though the deionized water is supplied onto the lower surface 92 as the second processing liquid from the deionized water supply part 184 which is a second processing liquid supply part in the above-described substrate processing apparatus 1, the second processing liquid may be any other processing liquid.

In the substrate processing apparatus 1 of FIG. 1, though the sealed space 160 is formed by the chamber 12 and the cup part 161 when the chemical liquid is supplied and the sealed space 120 is formed only by the chamber 12 when the deionized water is supplied, depending on the design of the substrate processing apparatus, the cup part 161 may be omitted and a sealed internal space may be formed only by the chamber 12 both when the chemical liquid is supplied and when the deionized water is supplied. Thus, the sealed space forming part which forms the sealed internal space in which the processing of the substrate 9 is performed by using the first processing liquid and the second processing liquid can be achieved in various manners.

In the substrate processing apparatus 1 of FIG. 1, the chamber cover 122 may be omitted, and the substrate 9 may be processed in an open processing space. Further, the annular supporting part which supports the outer edge portion of the substrate 9 in the horizontal state from below can be achieved in various manners. In the case where the chamber cover 122 is omitted as mentioned above, for example, a mechanism for gripping the substrate 9 is provided in the substrate supporting part 141.

In the above-described substrate processing apparatus 1, the substrate rotating mechanism which rotates the substrate supporting part 141 having an annular shape around the central axis J1 together with the substrate 9 around the central axis J1 may be achieved by a constitution (for example, a combination of an annular gear provided on the annular substrate supporting part 141 and a motor which engages with the gear to rotate the gear) other than the hollow motor having the annular stator part 151 and the annular rotor part 152. Further, depending on the design of the substrate processing apparatus 1, a rotating mechanism may rotate the lower surface facing part 211 with respect to the substrate 9. In other words, in the substrate processing apparatus 1, provided is a rotating mechanism for relatively rotating the substrate supporting part 141 together with the substrate 9 around the central axis J1 with respect to the lower surface facing part 211.

Furthermore, only one gas ejection nozzle 180 may be provided in the lower surface facing part 211. In other words, in the substrate processing apparatus 1, by providing at least one gas ejection nozzle 180 in the lower surface facing part 211, it becomes possible to heat the lower surface 92 of the substrate 9.

The substrate to be processed in the substrate processing apparatus is not limited to a semiconductor substrate, but may be a glass substrate or other substrates.

Figure 10:
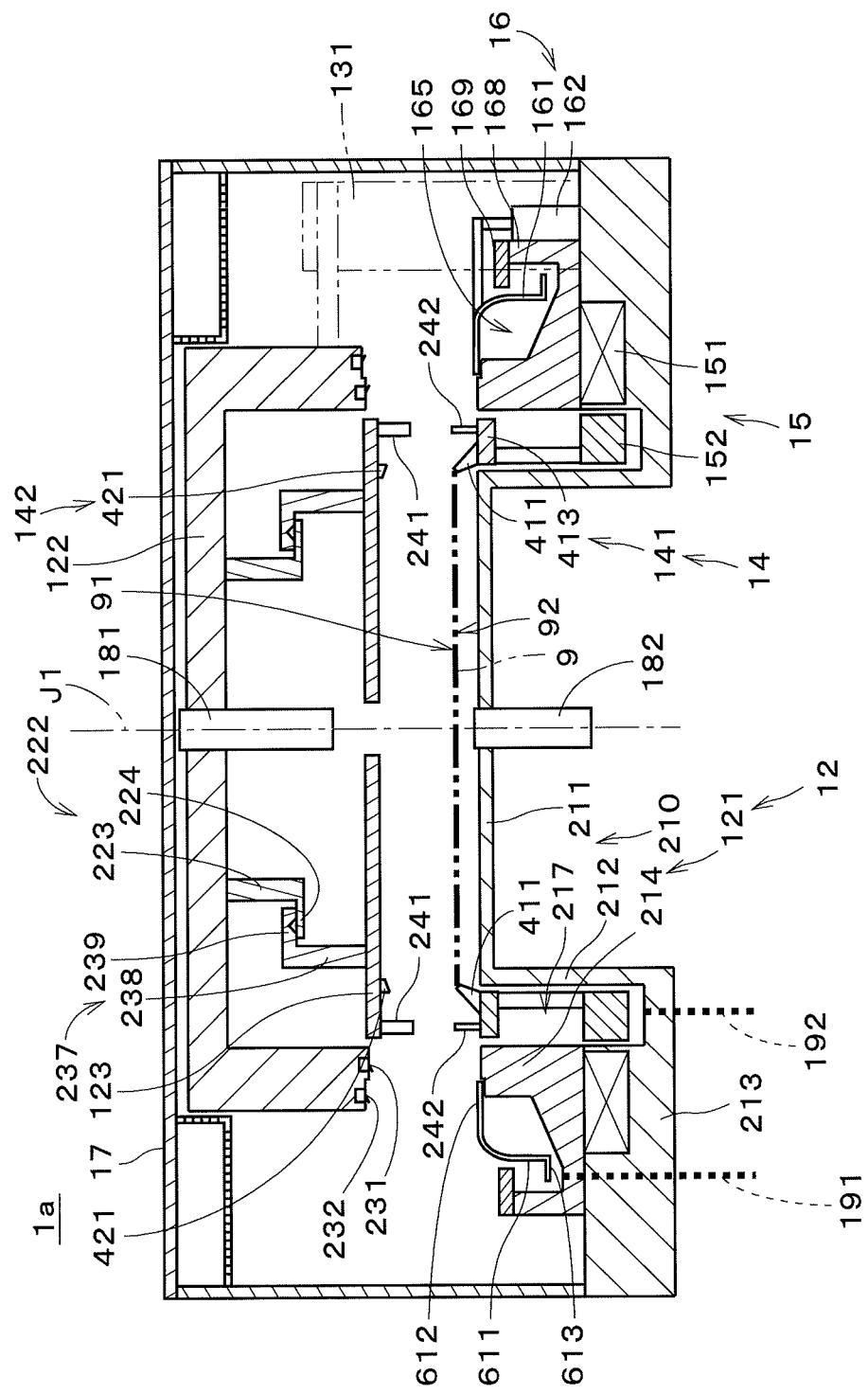
FIG. 10 is a cross-sectional view showing a substrate processing apparatus in accordance with a second preferred embodiment.

FIG. 10 is a cross-sectional view showing a substrate processing apparatus 1a in accordance with the second preferred embodiment of the present invention. The substrate processing apparatus 1a is a single-substrate processing apparatus for supplying a processing liquid to a semiconductor substrate 9 (hereinafter, referred to simply as a "substrate 9") having a substantially disk-like shape, to thereby process substrates 9 one by one. In FIG. 10, hatching of the cross sections of some constituent elements in the substrate processing apparatus 1a is omitted (the same applies to other cross-sectional views).

The substrate processing apparatus 1a includes the chamber 12, the top plate 123, the chamber opening and closing mechanism 131, the substrate holding part 14, the substrate rotating mechanism 15, the liquid receiving part 16, and the cover 17.

The chamber 12 includes the chamber body 121 and the chamber cover 122. The chamber body 121 and the chamber cover 122 are each formed of a non-magnetic material. The chamber body 121 includes the chamber bottom 210 and the chamber sidewall 214. The chamber bottom 210 includes the center portion 211 having a substantially disk-like shape, the inner sidewall 212 having a cylindrical shape extending downward from an outer edge portion of the center portion 211, and the base part 213 extending from the inner sidewall 212 outward in the radial direction. The chamber sidewall 214 has an annular shape around the central axis J1 directed in the vertical direction, protruding upward from a middle portion of the base part 213 in the radial direction. A member forming the chamber sidewall 214 also serves as part of the liquid receiving part 16, as described later. In the following description, a space surrounded by the chamber sidewall 214, the inner sidewall 212, and the base part 213 is referred to as the lower annular space 217. When the substrate 9 is supported by the substrate supporting part 141 (described later) of the substrate holding part 14, the lower surface 92 of the substrate 9 faces the upper surface 211a of the center portion 211.

The chamber cover 122 has a substantially disk-like shape perpendicular to the central axis J1, including the upper portion of the chamber 12. The chamber cover 122 closes the upper opening of the chamber body 121. FIG. 10 shows a state where the chamber cover 122 is separated from the chamber body 121. When the chamber cover 122 closes the upper opening of the chamber body 121, the outer edge portion of the chamber cover 122 comes into contact with the upper portion of the chamber sidewall 214.

The chamber opening and closing mechanism 131 moves the chamber cover 122 which is a movable part of the chamber 12 relatively to the chamber body 121 which is the other portion of the chamber 12 in the vertical direction. The chamber opening and closing mechanism 131 serves as the cover up-and-down moving mechanism for moving the chamber cover 122 up and down. When the chamber opening and closing mechanism 131 moves the chamber cover 122 in the vertical direction, the top plate 123 is also moved, together with the chamber cover 122, in a certain range in the vertical direction. When the chamber cover 122 comes into contact with the chamber body 121 to close the upper opening thereof and the chamber cover 122 is pressed toward the chamber body 121, an internal space (see FIG. 13 described later) which is sealed is formed inside the chamber 12.

The substrate holding part 14 is disposed in the chamber 12 and holds the substrate 9 in the horizontal state. In other words, the substrate 9 is held by the substrate holding part 14, in a state where the upper surface 91 thereof is directed upward, being perpendicular to the central axis J1. The substrate holding part 14 includes the above-described substrate supporting part 141 for supporting the outer edge portion of the substrate 9 from below and the substrate retaining part 142 for retaining the outer edge portion of the substrate 9 from above, which is supported by the substrate supporting part 141. The substrate supporting part 141 includes the supporting part base 413 having a substantially annular disk-like shape around the central axis J1 and the plurality of first contact parts 411 fixed to the upper surface of the supporting part base 413. The substrate retaining part 142 includes the plurality of second contact parts 421 fixed to the lower surface of the top plate 123. Positions of the plurality of second contact parts 421 in the circumferential direction are actually different from those of the plurality of first contact parts 411 in the circumferential direction.

The top plate 123 has a substantially disk-like shape perpendicular to the central axis J1. The top plate 123 is disposed below the chamber cover 122 and above the substrate supporting part 141. The top plate 123 has the opening at its center portion. When the substrate 9 is supported by the substrate supporting part 141, the upper surface 91 of the substrate 9 faces the lower surface of the top plate 123 which is perpendicular to the central axis J1. A diameter of the top plate 123 is larger than that of the substrate 9, and the outer edge portion of the top plate 123 is positioned outer than the outer edge portion of the substrate 9 in the radial direction all around the circumference. Thus, the top plate 123 extends along the upper surface 91 so as to cover the substrate 9 above the substrate 9.

In the state of FIG. 10, the top plate 123 is supported by the chamber cover 122. In more detail, on the lower surface of the chamber cover 122, the plate holding part 222 having an annular shape is provided. The plate holding part 222 includes the cylindrical portion 223 having a substantially cylindrical shape around the central axis J1 and the flange portion 224 having a substantially annular shape around the central axis J1. The cylindrical portion 223 extends downward from the lower surface of the chamber cover 122. The flange portion 224 extends from the lower end of the cylindrical portion 223 outward in the radial direction.

The top plate 123 includes the held part 237 having an annular shape. The held part 237 includes the cylindrical portion 238 having a substantially cylindrical shape around the central axis J1 and the flange portion 239 having a substantially annular shape around the central axis J1. The cylindrical portion 238 extends upward from the upper surface of the top plate 123. The flange portion 239 extends from the upper end of the cylindrical portion 238 inward in the radial direction. The cylindrical portion 238 is positioned outer than the cylindrical portion 223 of the plate holding part 222 in the radial direction and faces the cylindrical portion 223 in the radial direction. The flange portion 239 is positioned above the flange portion 224 of the plate holding part 222 and faces the flange portion 224 in the vertical direction. When the lower surface of the flange portion 239 of the held part 237 comes into contact with the upper surface of the flange portion 224 of the plate holding part 222, the top plate 123 is attached to the chamber cover 122, being suspended from the chamber cover 122.

The substrate rotating mechanism 15 of FIG. 10 is a so-called hollow motor. The substrate rotating mechanism 15 includes the stator part 151 having an annular shape around the central axis J1 and the rotor part 152 having an annular shape. The rotor part 152 includes a permanent magnet having a substantially annular shape. A surface of the permanent magnet is molded of a PTFE (polytetrafluoroethylene) resin. The rotor part 152 is disposed inside the lower annular space 217 in the internal space of the chamber 12. Above the rotor part 152, attached is the supporting part base 413 of the substrate supporting part 141 with a connecting member interposed therebetween. The supporting part base 413 is disposed above the rotor part 152.

The stator part 151 is disposed in the periphery of the rotor part 152 outside the chamber 12 (in other words, outside the internal space), i.e., disposed outer in the radial direction. In the present preferred embodiment, the stator part 151 is fixed to the base part 213 and positioned below the liquid receiving part 16. The stator part 151 includes a plurality of coils arranged in the circumferential direction around the central axis J1.

By supplying current to the stator part 151, a rotating force is generated around the central axis J1 between the stator part 151 and the rotor part 152. The rotor part 152 is thereby rotated in the horizontal state around the central axis J1. With a magnetic force exerted between the stator part 151 and the rotor part 152, the rotor part 152 floats in the chamber 12, not being in direct or indirect contact with the chamber 12, and rotates the substrate 9, being in a floating state, together with the substrate supporting part 141 around the central axis J1.

The liquid receiving part 16 includes the cup part 161 and the cup moving mechanism 162. As described earlier, part of the member forming the chamber sidewall 214 is included in the liquid receiving part 16. The cup part 161 has an annular shape around the central axis J1 and is positioned outer than the chamber sidewall 214 in the radial direction. The cup moving mechanism 162 moves the cup part 161 in the vertical direction.

The lower portion of the cup part 161 is positioned inside the liquid receiving recessed portion 165 which has an annular shape and is positioned outer than the chamber sidewall 214. At the upper end portion of the outer wall 168 having a substantially cylindrical shape surrounding the outer periphery of the liquid receiving recessed portion 165, the outer seal part 169 having a substantially annular disk-like shape around the central axis J1 is fixed. The outer seal part 169 extends from the upper end portion of the outer wall 168 inward in the radial direction, to cover the outer peripheral portion of the upper opening of the liquid receiving recessed portion 165 all around the circumference.

The upper nozzle 181 is fixed to the center portion of the chamber cover 122. The upper nozzle 181 is insertable into the opening of the center portion of the top plate 123. At the center of the center portion 211 of the chamber bottom 210, the lower nozzle 182 is attached. The bottom portion of the liquid receiving recessed portion 165 is connected to the first exhaust path 191. The bottom portion of the lower annular space 217 between the inner sidewall 212 and the chamber sidewall 214 is connected to the second exhaust path 192. The positions for attachment of the upper nozzle 181 and the lower nozzle 182 are not necessarily limited to the center portion, but may be, for example, positions facing the peripheral portion of the substrate 9.

Figure 11:
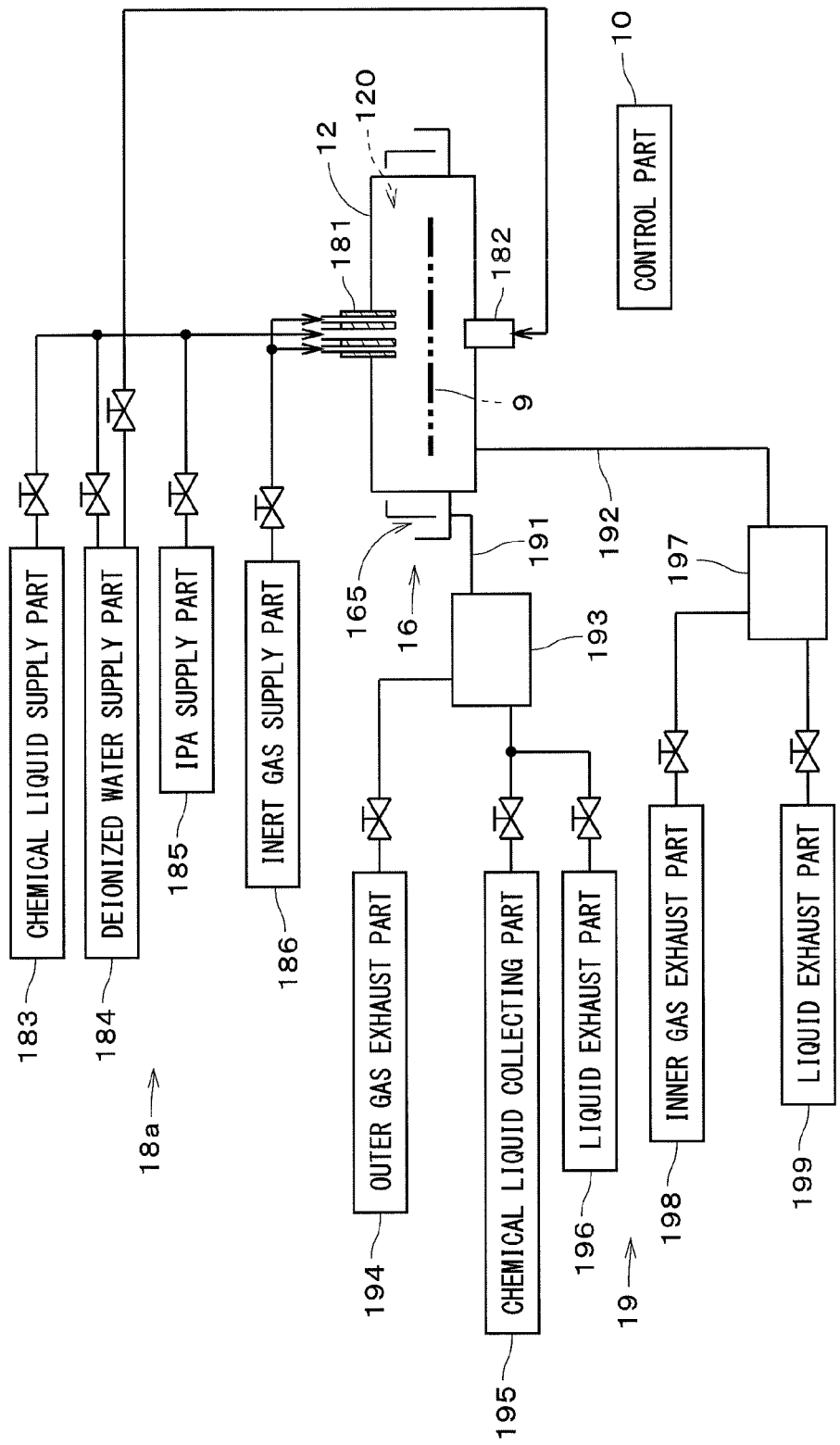
FIG. 11 is a block diagram showing a processing liquid supply part, an inert gas supply part, and a gas-liquid exhaust part.

FIG. 11 is a block diagram showing a processing liquid supply part 18a, the inert gas supply part 186 and the gas-liquid exhaust part 19 included in the substrate processing apparatus 1a. The processing liquid supply part 18a includes the chemical liquid supply part 183, the deionized water supply part 184, and the IPA supply part 185, besides the upper nozzle 181 and the lower nozzle 182 described above. The chemical liquid supply part 183, the deionized water supply part 184, and the IPA supply part 185 are each connected to the upper nozzle 181 with a valve interposed therebetween. The lower nozzle 182 is connected to the deionized water supply part 184 with a valve interposed therebetween. The upper nozzle 181 is also connected to the inert gas supply part 186 with a valve interposed therebetween. The upper nozzle 181 has the liquid ejection port at its center portion and has the gas ejection port therearound. Therefore, exactly, part of the upper nozzle 181 is part of a gas supply part for supplying gas into the chamber 12 in a broad sense. The lower nozzle 182 has the liquid ejection port at its center portion.

The first exhaust path 191 connected to the liquid receiving recessed portion 165 of the liquid receiving part 16 is connected to the gas-liquid separating part 193. The gas-liquid separating part 193 is connected to the outer gas exhaust part 194, the chemical liquid collecting part 195, and the liquid exhaust part 196 each with a valve interposed therebetween. The second exhaust path 192 connected to the chamber bottom 210 is connected to the gas-liquid separating part 197. The gas-liquid separating part 197 is connected to the inner gas exhaust part 198 and the liquid exhaust part 199 each with a valve interposed therebetween. The constituent elements in the processing liquid supply part 18a, the inert gas supply part 186, and the gas-liquid exhaust part 19 are controlled by the control part 10. The chamber opening and closing mechanism 131, the substrate holding part 14, the substrate rotating mechanism 15, and the cup moving mechanism 162 (see FIG. 10) are also controlled by the control part 10.

In the present preferred embodiment, a chemical liquid supplied from the chemical liquid supply part 183 onto the substrate 9 through the upper nozzle 181 is an etching solution such as hydrofluoric acid, a tetramethylammonium hydroxide solution, or the like. The deionized water supply part 184 supplies deionized water (DIW) onto the substrate 9 through the upper nozzle 181 or the lower nozzle 182. The IPA supply part 185 supplies isopropyl alcohol (IPA) onto the substrate 9 through the upper nozzle 181. In the substrate processing apparatus 1a, a processing liquid supply part for supplying any processing liquid other than the above processing liquids may be provided. Further, the inert gas supply part 186 supplies an inert gas into the chamber 12 through the upper nozzle 181. In the present preferred embodiment, the inert gas is nitrogen gas ($N_2$), but any gas other than nitrogen gas may be used.

As shown in FIG. 10, the cup part 161 includes the sidewall 611, the upper surface part 612, and the lower surface part 613. The sidewall 611 has a substantially cylindrical shape around the central axis J1. The upper surface part 612 has a substantially annular disk-like shape around the central axis J1, extending from the upper end portion of the sidewall 611 inward in the radial direction. The lower surface part 613 has substantially annular disk-like shape around the central axis J1, extending from the lower end portion of the sidewall 611 outward in the radial direction. The upper surface part 612 and the lower surface part 613 are substantially perpendicular to the central axis J1. In the state of FIG. 10, almost the whole of the sidewall 611 and the lower surface part 613 in the cup part 161 are positioned inside the liquid receiving recessed portion 165.

Figure 12:
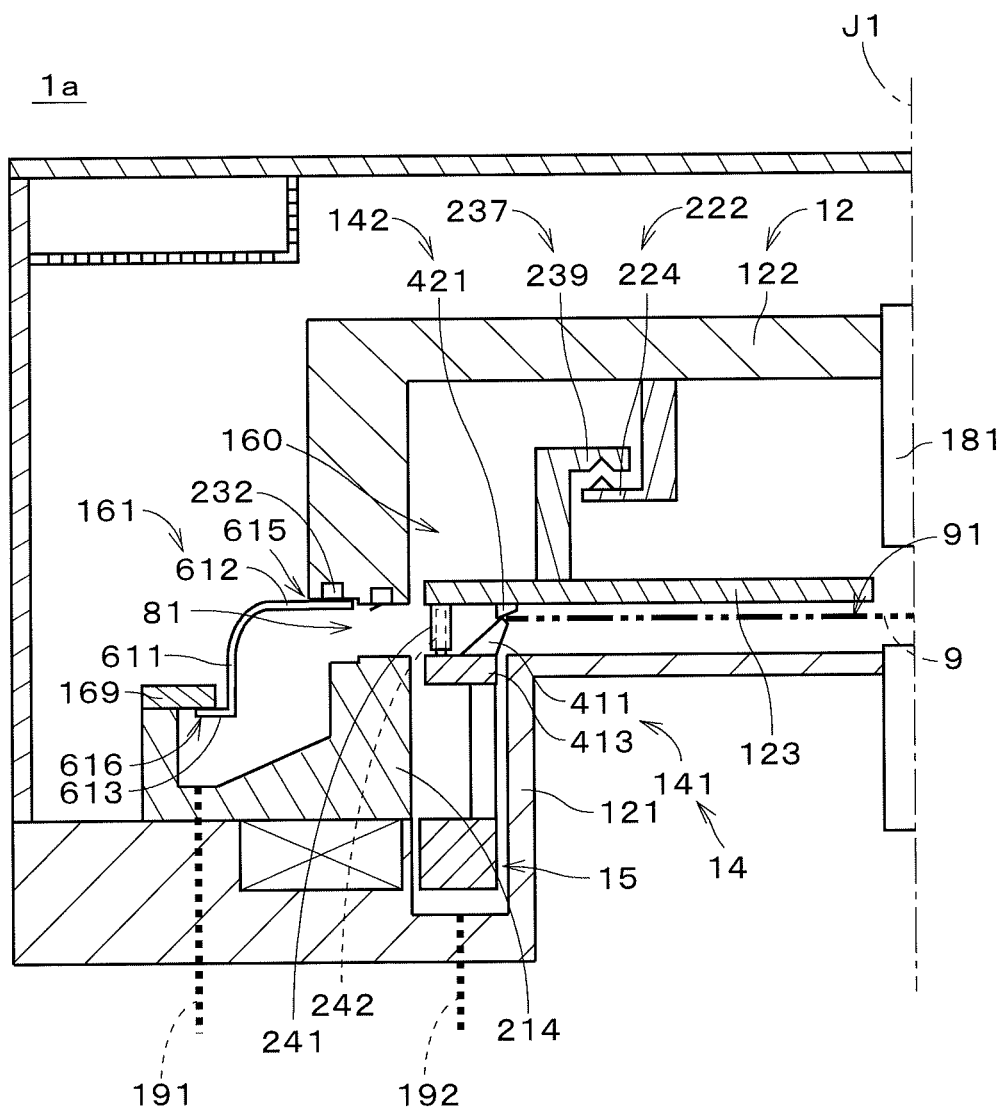
FIGS. 12 and 13 are cross-sectional views each showing part of the substrate processing apparatus.

On the lower surface of the outer edge portion of the chamber cover 122, provided are lip seals 231 and 232 each having an annular shape. The lip seal 231 is positioned above the upper end portion of the chamber sidewall 214. The lip seal 232 is positioned above the inner edge portion of the upper surface part 612 of the cup part 161. When the chamber cover 122 shown in FIG. 10 moves down and the cup part 161 moves up, as shown in FIG. 12, the lip seal 232 comes into contact with the inner edge portion of the upper surface part 612 of the cup part 161 in the vertical direction. Further, when the chamber cover 122 moves down to the chamber sidewall 214, as shown in FIG. 13, the lip seal 231 comes into contact with the upper end portion of the chamber sidewall 214 in the vertical direction.

As shown in FIG. 10, on the lower surface of the outer edge portion of the top plate 123, the plurality of first engagement parts 241 are arranged in the circumferential direction, and on the upper surface of the supporting part base 413, the plurality of second engagement parts 242 are arranged in the circumferential direction. It is preferable that these engagement parts should be provided in three or more pairs, and in the present preferred embodiment, four pairs are provided. At the lower portion of the first engagement part 241, provided is a recessed portion which is recessed upward. The second engagement part 242 protrudes upward from the supporting part base 413.

Figure 13:
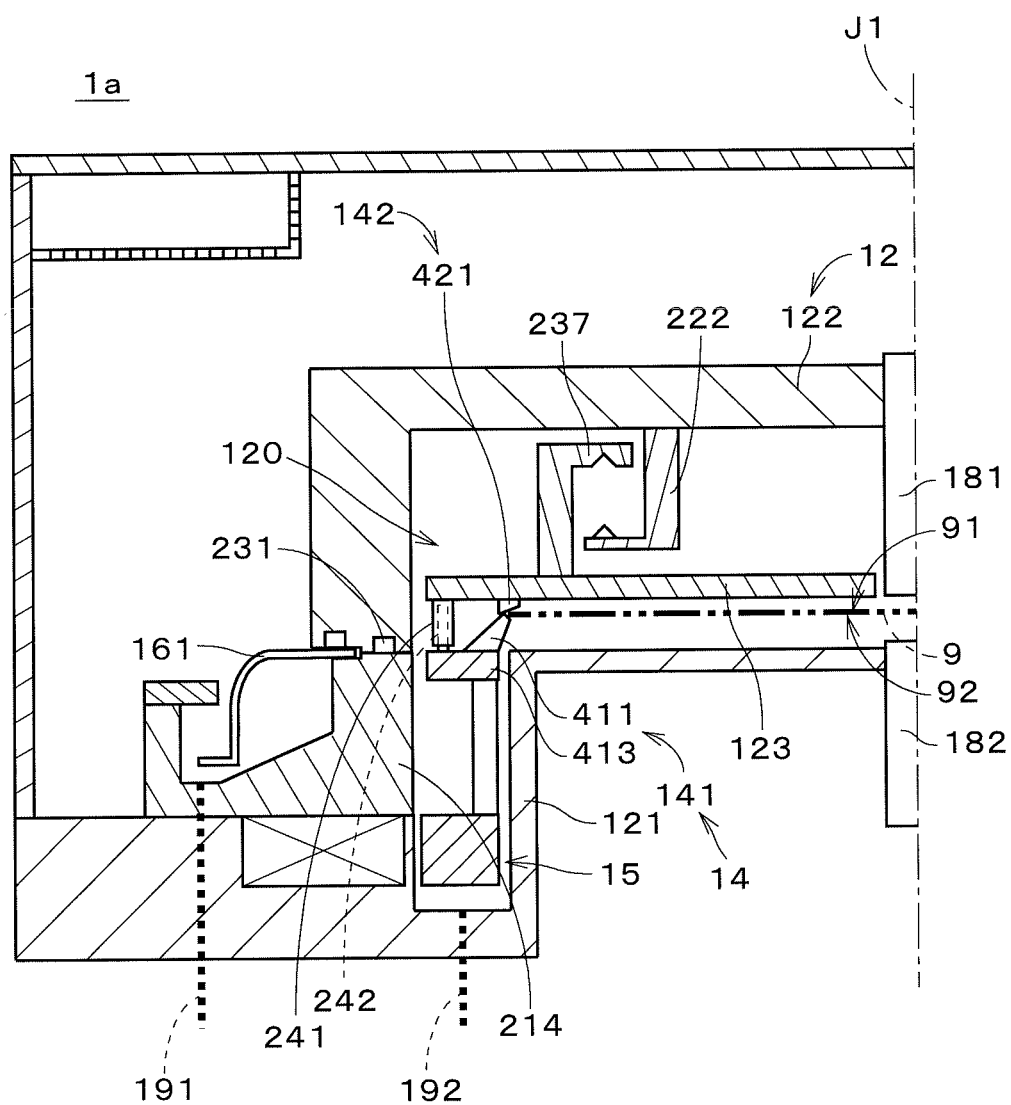

When the chamber cover 122 moves down, as shown in FIGS. 12 and 13, the second engagement part 242 engages with the recessed portion of the first engagement part 241. The top plate 123 thereby engages with the supporting part base 413 of the substrate supporting part 141 in the circumferential direction around the central axis J1. In other words, the first engagement part 241 and the second engagement part 242 serve as the position regulating member for regulating a relative position of the top plate 123 with respect to the substrate supporting part 141 in the rotation direction (for fixing the relative position in the circumferential direction). When the chamber cover 122 moves down, the substrate rotating mechanism 15 controls the rotation position of the supporting part base 413 so that the first engagement part 241 may engage with the second engagement part 242. Further, in the states of FIGS. 12 and 13, the plate holding part 222 releases holding of the top plate 123.

As described earlier, on the upper surface of the supporting part base 413 shown in FIG. 10, the plurality of first contact parts 411 of the substrate supporting part 141 are arranged in the circumferential direction. The plurality of first contact parts 411 are disposed inner than the plurality of second engagement parts 242 in the radial direction. Further, on the lower surface of the outer edge portion of the top plate 123, the plurality of second contact parts 421 of the substrate retaining part 142 are arranged in the circumferential direction. The second contact parts 421 are disposed inner than the plurality of first engagement parts 241 in the radial direction. As described above, the positions of the plurality of second contact parts 421 in the circumferential direction are actually different from those of the plurality of first contact parts 411 in the circumferential direction. In the present preferred embodiment, four first contact parts 411 are arranged at regular angular intervals in the circumferential direction. Further, in the circumferential direction, two second contact parts 421 are disposed adjacently on both sides of each first contact part 411, and assuming that the two second contact parts 421 adjacent to one first contact part 411 are regarded as one pair, four pairs of second contact parts 421 are disposed at regular angular intervals in the circumferential direction. As shown in FIGS. 12 and 13, in the state where the chamber cover 122 is positioned down, the plurality of second contact parts 421 of the substrate retaining part 142 are in contact with the outer edge portion of the substrate 9.

On the lower surface of the top plate 123 and on the supporting part base 413 of the substrate supporting part 141, provided are a plurality of pairs of magnets (not shown) in each of which two magnets face each other in the vertical direction. Hereinafter, each pair of magnets is referred to also as "a magnet pair". In the substrate processing apparatus 1a, a plurality of magnet pairs are disposed at regular angular intervals at positions different from those of the first contact parts 411, the second contact parts 421, the first engagement parts 241, and the second engagement parts 242 in the circumferential direction. In a state where the substrate retaining part 142 is in contact with the substrate 9, with a magnetic force (attractive force) exerted between each magnet pair, a downward force is exerted on the top plate 123. The substrate retaining part 142 thereby presses the substrate 9 toward the substrate supporting part 141.

In the substrate processing apparatus 1a, the substrate retaining part 142 presses the substrate 9 toward the substrate supporting part 141 with the weight of the top plate 123 and the magnetic forces of the magnet pairs, and it is thereby possible to strongly hold the substrate 9 being sandwiched from above and below by the substrate retaining part 142 and the substrate supporting part 141. In the states shown in FIGS. 12 and 13, the plate holding part 222 is out of contact with the held part 237, and the top plate 123, being independent from the chamber cover 122, is rotated by the substrate rotating mechanism 15, together with the substrate holding part 14 and the substrate 9 held by the substrate holding part 14.

Figure 14:
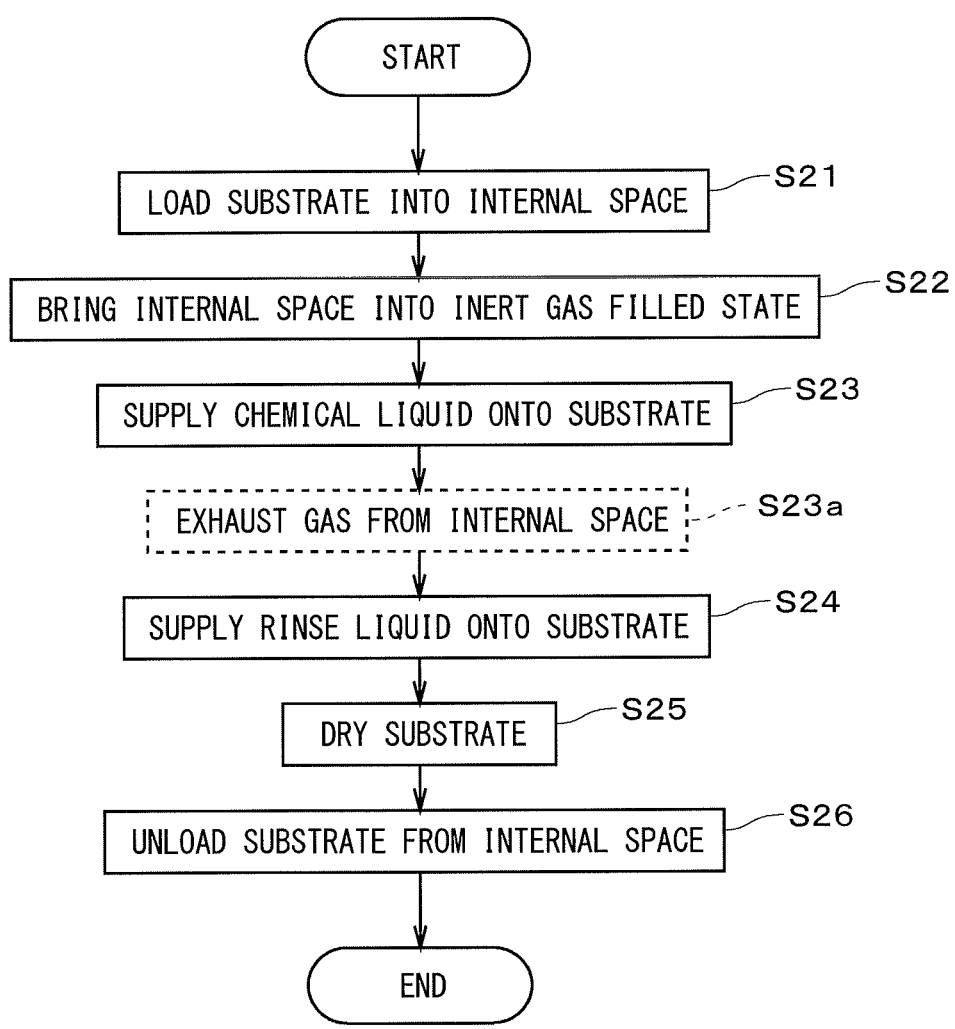
FIG. 14 is a flowchart showing an operation flow of the substrate processing apparatus.
Figure 15:
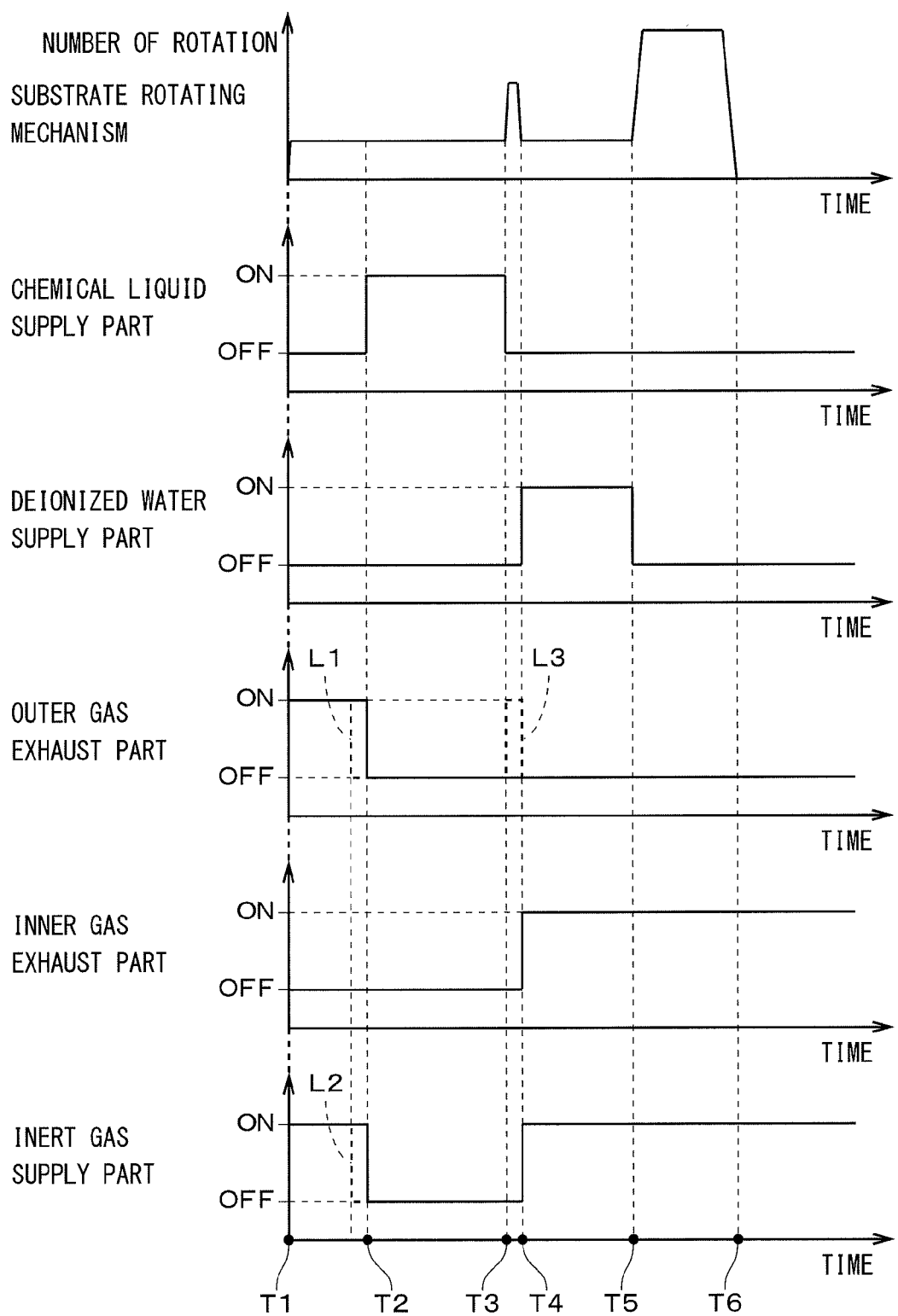
FIG. 15 is a timing chart showing operation timings of constituent elements in the substrate processing apparatus.

FIG. 14 is a flowchart showing an operation flow for processing the substrate 9 in the substrate processing apparatus 1a. FIG. 15 is a timing chart showing operation timings of constituent elements in the substrate processing apparatus 1a under the control of the control part 10. In FIG. 15, from the top stage downward, the operation timings of the substrate rotating mechanism 15, the chemical liquid supply part 183, the deionized water supply part 184, the outer gas exhaust part 194, the inner gas exhaust part 198, and the inert gas supply part 186 are shown in this order. The process surrounded by broken line in FIG. 14 is performed in an exemplary processing described later.

In the substrate processing apparatus 1a, first, in a state where the chamber cover 122 is positioned upper as shown in FIG. 10, the substrate 9 is loaded into the internal space of the chamber 12 by an external transfer mechanism and supported by the substrate supporting part 141 from below (Step S21). Subsequently, when the chamber cover 122 moves down to the position shown in FIG. 12, the substrate 9 is held by the substrate retaining part 142 and the substrate supporting part 141. At that time, the chamber cover 122 and the chamber sidewall 214 are separated from each other, and the annular opening 81 is formed between the chamber cover 122 and the chamber sidewall 214 around the substrate 9 (in other words, outer than the substrate 9 in the radial direction). Hereinafter, a state of the chamber 12 where the annular opening 81 is formed is referred to as the "semiopen state". Further, the state of FIG. 10 is referred to as the "open state".

The cup part 161 moves upward from the position shown in FIG. 10, to be positioned outer than the annular opening 81 in the radial direction all around the circumference, as shown in FIG. 12. Thus, the cup moving mechanism 162 (see FIG. 10) moves the cup part 161 between the first position which is outer than the annular opening 81 in the radial direction and the second position below the first position (see FIG. 10) in the vertical direction. In the cup part 161 positioned at the first position, the sidewall 611 faces the annular opening 81 in the radial direction.

In the cup part 161 positioned at the first position, the upper surface of the inner edge portion of the upper surface part 612 is in contact with the lip seal 232 of the chamber cover 122 all around the circumference. With this contact, between the chamber cover 122 and the upper surface part 612 of the cup part 161, formed is the first seal 615 for preventing the passage of gas and/or liquid. Further, the upper surface of the lower surface part 613 of the cup part 161 is in contact with the lower surface of the outer seal part 169 of the chamber body 121 all around the circumference. With this contact, between the chamber body 121 and the lower surface part 613 of the cup part 161, formed is the second seal 616 for preventing the passage of gas and/or liquid.

In the substrate processing apparatus 1a, the upper surface part 612 of the cup part 161 serves as the first seal part which forms the first seal 615 at the first position, and the lower surface part 613 thereof serves as the second seal part which forms the second seal 616 at the first position. Then, the chamber 12 in the semiopen state (in other words, the chamber body 121 and the chamber cover 122 in the state where the annular opening 81 is formed) and the cup part 161 positioned at the first position form the sealed internal space 160 (hereinafter, referred to as the "sealed space 160"). Thus, in the substrate processing apparatus 1a, the sealed space forming part which forms the sealed space 160 is achieved, by the chamber 12 and the cup part 161.

After the sealed space 160 is formed at the time T1 in FIG. 15, rotation of the substrate 9 is started by the substrate rotating mechanism 15 at a constant number of rotation (relatively low number of rotation, and hereinafter, referred to as "the steady number of rotation"). Further, the supply of the inert gas (herein, nitrogen gas) from the inert gas supply part 186 into the sealed space 160 is started, and the exhaust of gas from the sealed space 160 by the outer gas exhaust part 194 is also started. The supply of the inert gas into the sealed space 160 through the upper nozzle 181 and the exhaust of the gas from the sealed space 160 through the first exhaust path 191 are continued for a certain time period or more. The sealed space 160 is thereby brought into the inert gas filled state where the inert gas is filled therein (in other words, into the low oxygen atmosphere where the oxygen concentration is low) (Step S22). Further, the supply of the inert gas into the sealed space 160 and the exhaust of the gas from the sealed space 160 may be performed in the open state shown in FIG. 10.

As shown in FIG. 15, at the time T2 after a predetermined time (e.g., 20 seconds) elapses from the formation of the sealed space 160, the supply of the inert gas into the sealed space 160 by the inert gas supply part 186 and the exhaust of the gas from the sealed space 160 by the outer gas exhaust part 194 are stopped. Further, almost concurrently with these operations (e.g., within several seconds before or after these operations), the supply of the chemical liquid onto the upper surface 91 of the substrate 9 is started by the chemical liquid supply part 183 (Step S23). As shown in FIG. 12, the chemical liquid from the chemical liquid supply part 183 is gently and continuously supplied onto the center portion of the upper surface 91 of the substrate 9 from the upper nozzle 181 through the opening of the center portion of the top plate 123. With the rotation of the substrate 9, the chemical liquid spreads toward the outer peripheral portion and the entire upper surface 91 is thereby covered with the chemical liquid.

As described earlier, the supply of the chemical liquid onto the upper surface 91 of the substrate 9 is performed while the supply of the inert gas into the sealed space 160 and the exhaust of the gas from the sealed space 160 are stopped. Therefore, etching is performed on the upper surface 91 by using the chemical liquid in the sealed space 160 which is in the inert gas filled state, with the flow of the gas into/from the sealed space 160 blocked. In an actual case, since the lower surface of the top plate 123 is close to the upper surface 91 of the substrate 9, the etching of the substrate 9 is performed in a very narrow space between the lower surface of the top plate 123 and the upper surface 91.

In the sealed space 160, the chemical liquid scattered from the upper surface 91 of the substrate 9 is received by the cup part 161 through the annular opening 81 and flows into the gas-liquid separating part 193 through the first exhaust path 191 shown in FIG. 11. In the chemical liquid collecting part 195, the chemical liquid is collected from the gas-liquid separating part 193, and after removing impurities or the like from the chemical liquid through a filter or the like, the chemical liquid is reused.

As shown in FIG. 15, at the time T3 after a predetermined time (e.g., 60 to 120 seconds) elapses from the start of the supply of the chemical liquid, the supply of the chemical liquid from the chemical liquid supply part 183 is stopped. Then, the substrate rotating mechanism 15 increases the number of rotation of the substrate 9 to be higher than the steady number of rotation for a predetermined time period (e.g., 1 to 3 seconds) until the time T4, to thereby remove the chemical liquid from the substrate 9. At that time, since the top plate 123 is rotated together with the substrate supporting part 141, almost no chemical liquid remains on the lower surface of the top plate 123 and therefore, the chemical liquid never drops from the top plate 123.

At the time T4, the number of rotation of the substrate 9 is decreased to the steady number of rotation. Further, as shown in FIG. 13, the chamber cover 122 and the cup part 161 move down. Then, the lip seal 231 of the chamber cover 122 comes into contact with the upper portion of the chamber sidewall 214, and the chamber 12 thereby forms the sealed internal space 120 (hereinafter, referred to as the "sealed space 120") therein. In a state where the chamber 12 is sealed, the substrate 9 directly faces the inner wall of the chamber 12 and there exists no other liquid receiving part therebetween. Further, the supply of the inert gas into the sealed space 120 from the inert gas supply part 186 is started again and the exhaust of the gas from the sealed space 120 by the inner gas exhaust part 198 is started. Furthermore, the supply of the deionized water serving as the rinse liquid onto the substrate 9 is started by the deionized water supply part 184 serving as a rinse liquid supply part (Step S24).

The deionized water from the deionized water supply part 184 is ejected from the upper nozzle 181 and the lower nozzle 182 and continuously supplied onto the respective center portions of the upper surface 91 and the lower surface 92 of the substrate 9. With the rotation of the substrate 9, the deionized water spreads toward the respective outer peripheral portions of the upper surface 91 and the lower surface 92 and is scattered outward from the outer peripheral edge of the substrate 9. The deionized water scattered from the substrate 9 is received by the inner wall of the chamber 12 (i.e., the respective inner walls of the chamber cover 122 and the chamber sidewall 214) and discarded through the second exhaust path 192, the gas-liquid separating part 197, and the liquid exhaust part 199 shown in FIG. 11 (the same applies to drying of the substrate 9 described later). With this operation, cleaning of the inside of the chamber 12 is substantially performed. In an actual case, after the number of rotation of the substrate 9 is decreased to the steady number of rotation, the chamber cover 122 and the cup part 161 move to form the sealed space 120 shown in FIG. 13 and subsequently the supply of the deionized water from the deionized water supply part 184 is started, and therefore, there is a slight time lag between these operations, but in FIG. 15, for convenience of illustration, the time lag is ignored.

At the time T5 after a predetermined time elapses from the start of supply of the deionized water, the supply of the deionized water from the deionized water supply part 184 is stopped. Then, in the sealed space 120, the number of rotation of the substrate 9 is increased to be sufficiently higher than the steady number of rotation. The deionized water is thereby removed from the substrate 9, and drying of the substrate 9 is performed (Step S25). At the time T6 after a predetermined time elapses from the start of drying of the substrate 9, the rotation of the substrate 9 is stopped.

After that, the chamber cover 122 and the top plate 123 move up, and the chamber 12 is brought into the open state as shown in FIG. 10. In Step S25, since the top plate 123 is rotated together with the substrate supporting part 141, almost no liquid remains on the lower surface of the top plate 123 and therefore, no liquid drops from the top plate 123 onto the substrate 9 when the chamber cover 122 moves up. The substrate 9 is unloaded from the internal space of the chamber 12 by the external transfer mechanism (Step S26). Further, after the deionized water supply part 184 supplies the deionized water and before the substrate 9 is dried, the IPA supply part 185 may supply the IPA onto the substrate 9, to thereby replace the deionized water with the IPA on the substrate 9.

Herein, description will be made on a comparative example of the substrate processing apparatus in which the supply of the inert gas into the sealed space 160 and the exhaust of the gas from the sealed space 160 are continued in the processing of the substrate 9 by using the chemical liquid in Step S23. In the substrate processing apparatus of this comparative example, since the flow of the gas into/from (into and from) the sealed space 160 continues when the chemical liquid (water or the like contained therein) supplied onto the substrate 9 is vaporized, a humidity of the sealed space 160 is hard to be high. Therefore, the vaporization of the chemical liquid continuously occurs, and the temperature of the substrate 9 decreases due to the heat of vaporization. The decrease in the temperature of the substrate 9 becomes remarkable at the outer edge portion of the substrate 9, and the uniformity of the temperature distribution of the substrate is deteriorated. As a result, the uniformity of the processing of the substrate 9 by using the chemical liquid is deteriorated.

Though it may be possible to suppress deterioration in the uniformity of the temperature distribution of the substrate 9 by supplying the chemical liquid which is heated to a certain temperature onto the substrate 9 in a large flow, the amount of chemical liquid consumed disadvantageously increases. In the substrate processing apparatus where the substrate is processed in an open processing space, like in Japanese Patent Application Laid-Open No. 2002-305177 (Document 2), in order to prevent diffusion of the gas containing the chemical liquid component to the outside, it is absolutely necessary to exhaust the gas from the processing space by an gas exhaust part in the processing of the substrate by using the chemical liquid. Therefore, like in the substrate processing apparatus of the above comparative example, the uniformity of the substrate processing using the chemical liquid is deteriorated. Actually, in such a substrate processing apparatus, in order to prevent deposition of particles onto the substrate, a downflow is also formed, and in this case, the uniformity of the processing of the substrate by using the chemical liquid is further deteriorated.

On the other hand, in the substrate processing apparatus 1*a*, the sealed space 160 is formed by the chamber 12 and the cup part 161 serving as the sealed space forming part, and when the chemical liquid is supplied onto the substrate 9 by the chemical liquid supply part 183, the supply of the inert gas into the sealed space 160 and the exhaust of the gas from the sealed space 160 are stopped. Thus, by supplying the chemical liquid onto the substrate 9 in the sealed space 160 in which the inflow and the outflow of gas are blocked, it is possible to keep a state where the sealed space 160 is humidified mainly by water contained in the chemical liquid (as a matter of course, the chemical liquid component may be contained in the atmosphere inside the sealed space 160). As a result, it is possible to suppress deterioration in the uniformity of the temperature distribution of the substrate 9 due to the vaporization of the chemical liquid, and therefore, it is possible to perform uniform processing on the upper surface 91 of the substrate 9 by using the chemical liquid with the amount of chemical liquid consumption reduced. Further, it is possible to reduce the COO (Cost Of Ownership) of the substrate processing apparatus 1a.

Figure 16:
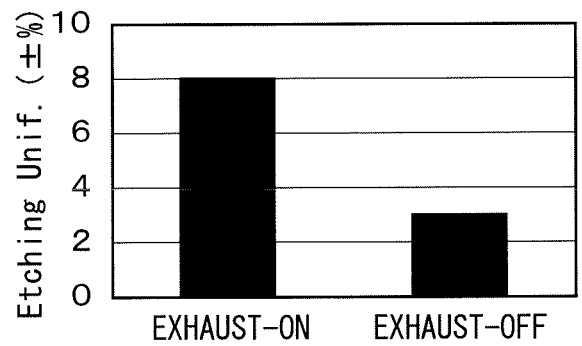
FIG. 16 is a graph showing an experimental result on etching.

FIG. 16 is a graph showing an experimental result on etching. In FIG. 16, "exhaust-ON" indicates the uniformity of the etching in the substrate processing apparatus of the comparative example and "exhaust-OFF" indicates the uniformity of the etching in the substrate processing apparatus 1a of FIG. 10. Herein, it is assumed that a value indicating the uniformity (Etching Unif.) is obtained by (((A−B)/2C) *100) by using a maximum value A, a minimum value B, and an average value C of the etching amount at a plurality of positions on the substrate 9. The uniformity of etching in the substrate processing apparatus 1a is 3% while the uniformity of etching in the substrate processing apparatus of the comparative example is 8%. It can be seen from this experimental result that the uniformity of etching is improved by supplying the chemical liquid onto the substrate 9 in the sealed space 160 in which the inflow and the outflow of gas are blocked.

In the substrate processing apparatus 1a, the inert gas supply part 186 supplies the inert gas into the sealed space 160 while the outer gas exhaust part 194 exhausts the gas from the sealed space 160, to thereby bring the sealed space 160 into the inert gas filled state. Then, the processing using the chemical liquid is performed in the inert gas filled state (i.e., a low oxygen atmosphere). It is thereby possible to prevent deposition of particles on the substrate 9 and use a combustible chemical liquid or the like.

The substrate processing apparatus 1a further includes the top plate 123 which becomes close to the upper surface 91 when the chemical liquid supply part 183 supplies the chemical liquid onto the substrate 9, and the upper nozzle 181 for supplying the chemical liquid from the chemical liquid supply part 183 to between the top plate 123 and the upper surface 91. It is thereby possible to achieve the supply of the chemical liquid onto the upper surface 91 of the substrate 9 with the upper surface 91 facing the narrow space between the upper surface 91 and the top plate 123. As a result, it is possible to further suppress the vaporization of the chemical liquid and perform more uniform processing onto the upper surface 91 of the substrate 9. Further, since an outer peripheral edge of the top plate 123 is positioned outer than the outer peripheral edge of the substrate 9 in the radial direction all around the circumference, the entire outer peripheral portion of the upper surface 91 of the substrate 9 is covered with the top plate 123. As a result, it is possible to suppress deposition of the processing liquid which is scattered from the outer peripheral edge of the substrate 9 and bounced off the inner wall of the chamber 12 and the like. Further, by performing the processing in the state where the top plate 123 is close to the substrate 9, it is possible to reduce the amount of chemical liquid needed to cover the upper surface 91 of the substrate 9 therewith.

Depending on the design of piping from the inert gas supply part 186 to the sealed space 160 and piping from the sealed space 160 to the outer gas exhaust part 194, even immediately after the supply of the inert gas into the sealed space 160 by the inert gas supply part 186 and the exhaust of the gas from the sealed space 160 by the outer gas exhaust part 194 are stopped, the gas sometimes flows in the sealed space 160 for a short time. In such a case, as indicated by the thick broken lines L1 and L2 in FIG. 15, the supply of the inert gas into the sealed space 160 by the inert gas supply part 186 and the exhaust of the gas from the sealed space 160 by the outer gas exhaust part 194 may be stopped before (e.g., 1 to 3 seconds before) the start of the supply of the chemical liquid onto the substrate 9 at the time T2. With this operation, when the supply of the chemical liquid onto the substrate 9 is started, it is possible to more reliably block the flow of the gas into/from the sealed space 160. As a result, it is possible to perform more uniform processing on the upper surface 91 of the substrate 9.

In a preferable operation example of the substrate processing apparatus 1a, after the supply of the chemical liquid onto the substrate 9 in Step S23 of FIG. 14 is finished and before the supply of the deionized water onto the substrate 9 in Step S24 is started, i.e., between the time T3 and the time T4 in FIG. 15, as indicated by the thick broken line L3, the outer gas exhaust part 194 exhausts the gas from the sealed space 160 (Step S23a). It is thereby possible to suppress any effect on the uniformity of the processing using the chemical liquid, which is caused by mixture of the chemical liquid component in the atmosphere into the deionized water serving as the rinse liquid. In this case, the gas is always exhausted from the internal space of the chamber 12 by the outer gas exhaust part 194 or the inner gas exhaust part 198 except when the chemical liquid is supplied onto the substrate 9.

The above-described substrate processing apparatus 1a allows various variations. In the substrate processing apparatus 1a of FIG. 10, though the sealed space 160 is formed by the chamber 12 and the cup part 161 when the chemical liquid is supplied and the sealed space 120 is formed only by the chamber 12 when the deionized water is supplied, depending on the design of the substrate processing apparatus, the cup part 161 may be omitted and a sealed internal space may be formed only by the chamber 12 both when the chemical liquid is supplied and when the deionized water is supplied. Thus, the sealed space forming part which forms the sealed internal space can be achieved in various manners.

The chamber opening and closing mechanism 131 serving as the sealed space opening and closing mechanism is not necessarily needed to move the chamber cover 122 in the vertical direction, but may move the chamber body 121 in the vertical direction with the chamber cover 122 fixed, to thereby switch the state of the chamber 12 among the open state, the semiopen state, and a sealed state. Further, in the substrate processing apparatus in which the cup part 161 is omitted as described above, a loading port may be provided at a side portion of the chamber serving as the sealed space forming part. In this case, the sealed space opening and closing mechanism moves a movable part for closing the loading port with respect to the other portion, to thereby open and close the chamber. Thus, in the substrate processing apparatus, in loading/unloading of the substrate 9, the sealed space opening and closing mechanism moves the movable part which is a portion of the sealed space forming part with respect to the other portion, to thereby open and close the sealed space forming part.

The substrate holding part 14 is not necessarily needed to be provided separately as the substrate supporting part 141 and the substrate retaining part 142. For example, a plurality of holding structures each having a recessed portion which is recessed outward in the radial direction may be provided on the supporting part base 413. In this case, when the outer edge portion of the substrate 9 is inserted into the recessed portion of each holding structure, each holding structure comes into contact with the substrate 9 from below, side, and above, to thereby hold the substrate 9.

In the substrate processing apparatus, various processings other than the above-described processings may be performed by supplying various processing liquids (e.g., the SPM (sulfuric acid/hydrogen peroxide mixture) liquid) onto the substrate 9. Further, after the supply of the chemical liquid onto the substrate 9 is finished, a rinse liquid other than the deionized water may be supplied onto the upper surface 91 of the substrate 9.

Though the gas exhaust part is achieved by the outer gas exhaust part 194 and the inner gas exhaust part 198, to exhaust gas from the internal space in the sealed space forming part in the substrate processing apparatus 1a, depending on the design of the substrate processing apparatus, only one gas exhaust part may be provided.

The substrate to be processed in the substrate processing apparatus is not limited to a semiconductor substrate, but may be a glass substrate or other substrates.

The configurations of the above-described preferred embodiments and variations may be appropriately combined as long as there are no mutual inconsistencies.

While the invention has been shown and described in detail, the foregoing description is in all aspects illustrative and not restrictive. It is therefore understood that numerous modifications and variations can be devised without departing from the scope of the invention. This application claims priority benefit under 35 U.S.C. Section 119 of Japanese Patent Application No. 2013-026224 filed in the Japan Patent Office on Feb. 14, 2013 and Japanese Patent Application No. 2013-027387 filed in the Japan Patent Office on Feb. 15, 2013, the entire disclosures of which are incorporated herein by reference.

REFERENCE SIGNS LIST 1, 1a Substrate processing apparatus
9 Substrate
10 Control part
12 Chamber
14 Substrate holding part
15 Substrate rotating mechanism
91 Upper surface
92 Lower surface
120, 160 Internal space
122 Chamber cover
123 Top plate
131 Chamber opening and closing mechanism
141 Substrate supporting part
161 Cup part
180 Gas ejection nozzle
181 Upper nozzle
182 Lower nozzle
183 Chemical liquid supply part
184 Deionized water supply part
186 Inert gas supply part
194 Outer gas exhaust part
198 Inner gas exhaust part
211 Lower surface facing part
211a Facing surface
1802 Ejection port
J1 Central axis
S22 to S24, S23a Step

The invention claimed is:

1. A substrate processing method of processing a substrate in a substrate processing apparatus, wherein
said substrate processing apparatus comprises:
a sealed space forming part forming an internal space which is sealed;
a sealed space opening and closing mechanism for moving a movable part which is part of said sealed space forming part relatively to the other portion, to thereby open and close said sealed space forming part;
a substrate holding part disposed in said sealed space forming part, for holding a substrate in a horizontal state;
a chemical liquid supply part for supplying a chemical liquid onto an upper surface of said substrate;
an inert gas supply part for supplying an inert gas into said internal space; and
a gas exhaust part for exhausting gas from said internal space,
said substrate processing method comprising:
a) supplying said inert gas into said internal space by said inert gas supply part while exhausting gas from said internal space by said gas exhaust part, to thereby bring said internal space which is sealed into an inert gas filled state; and
b) supplying said chemical liquid onto said substrate in said inert gas filled state by said chemical liquid supply part,
wherein supply of said inert gas into said internal space and exhaust of gas from said internal space are stopped when said chemical liquid is supplied onto said substrate in said operation b).

2. The substrate processing method according to claim 1, wherein
supply of said inert gas into said internal space and exhaust of gas from said internal space are stopped before starting supply of said chemical liquid onto said substrate in said operation b).

3. The substrate processing method according to claim 1, further comprising:
c) supplying a rinse liquid onto said upper surface of said substrate by a rinse liquid supply part after said operation b).

4. The substrate processing method according to claim 3, further comprising:
exhausting gas from said internal space by said gas exhaust part between said operation b) and said operation c).

* * * * *